(12) United States Patent
Hao

(10) Patent No.: US 11,474,139 B2
(45) Date of Patent: **\*Oct. 18, 2022**

(54) FAULT DIRECTION CALCULATION DURING CURRENT TRANSFORMER SATURATION

(71) Applicant: Schweitzer Engineering Laboratories, Inc., Pullman, WA (US)

(72) Inventor: Kei Hao, Anaheim, CA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 808 days.

This patent is subject to a terminal disclaimer.

(21) Appl. No.: 16/376,635

(22) Filed: Apr. 5, 2019

(65) Prior Publication Data

US 2020/0319240 A1    Oct. 8, 2020

(51) Int. Cl.
*G01R 31/08* (2020.01)
*H02H 1/00* (2006.01)

(52) U.S. Cl.
CPC ......... *G01R 31/085* (2013.01); *G01R 31/088* (2013.01); *H02H 1/0007* (2013.01)

(58) Field of Classification Search
CPC ... G01R 31/085; G01R 31/088; G02H 1/0007
See application file for complete search history.

(56) References Cited

U.S. PATENT DOCUMENTS

| | | | |
|---|---|---|---|
| 5,311,392 A * | 5/1994 | Kinney | H02H 3/0935 361/87 |
| 5,974,361 A | 10/1999 | Vu | |
| 6,040,689 A * | 3/2000 | Gluszek | G01R 19/15 324/102 |
| 9,250,282 B2 | 2/2016 | Ukil et al. | |
| 9,366,715 B2 | 6/2016 | Ukil et al. | |
| 11,162,994 B2 * | 11/2021 | Hao | G01R 19/2513 |

(Continued)

FOREIGN PATENT DOCUMENTS

| | | |
|---|---|---|
| CA | 2929382 | 5/2014 |
| CN | 106099850 | 11/2016 |

OTHER PUBLICATIONS

Ukil, Abhisek, et al., "Current-Only Directional Overcurrent Relay". IEEE Sensors Journal, Nov. 22, 2010, vol. 11, Issue 6.

(Continued)

*Primary Examiner* — Alexander Satanovsky
*Assistant Examiner* — Sharah Zaab
(74) *Attorney, Agent, or Firm* — Richard M. Edge

(57) ABSTRACT

Improvements in the functioning of a line-mounted device to calculate a direction to a fault during current transformer (CT) saturation are disclosed herein. The line-mounted device may determine a load direction using voltage and current zero-crossings and a power system frequency before the fault condition. The line-mounted device may determine a fault direction in relation to the direction to the load after calculating and removing direct current (DC) components of a sampled current signal using valid sample pairs obtained during unsaturated regions of peaks of the sampled current signal. The line-mounted device may indicate the direction to the fault. A system of line-mounted devices may be used to determine a faulted section of a power system using indications of fault direction.

13 Claims, 18 Drawing Sheets

(56) References Cited

U.S. PATENT DOCUMENTS

| | | | |
|---|---|---|---|
| 2009/0009180 A1* | 1/2009 | Varghai | H02H 3/081 |
| | | | 324/521 |
| 2012/0086459 A1* | 4/2012 | Kim | G01R 31/086 |
| | | | 324/525 |
| 2013/0141827 A1 | 6/2013 | Ukil et al. | |
| 2013/0221977 A1* | 8/2013 | Ukil | H02H 3/081 |
| | | | 324/522 |
| 2017/0276718 A1* | 9/2017 | Dzienis | H03H 7/0138 |
| 2018/0034258 A1* | 2/2018 | Schweitzer, III | H02H 3/05 |
| 2019/0116403 A1* | 4/2019 | Yogeeswaran | H04B 10/2575 |

OTHER PUBLICATIONS

Ukil, Abhisek, et al., "Current-Only Directional Overcurrent Protection for Distribution Automation: Challenges and Solutions". IEEE Transactions on Smart Grid, Aug. 22, 2012, vol. 3, Issue 4.
Chothani et al. "New Algorithm for Current Transformer Saturation Detection and Compensation Based on Derivatives of Secondary Currents and Newton's Backward Difference Formulae", IET Gener. Transm. Distrub., 2014, vol. 8, Iss. 5, pp. 841-850, 2014.

\* cited by examiner

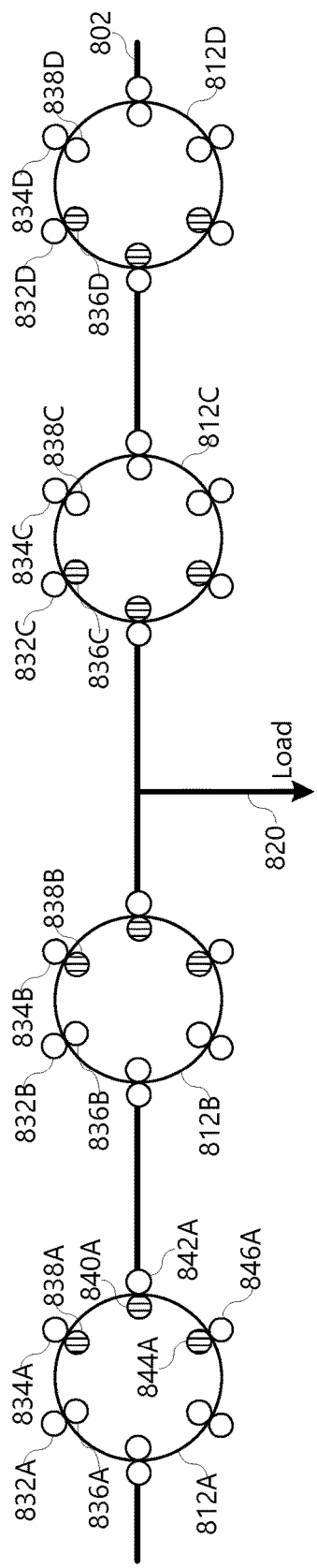
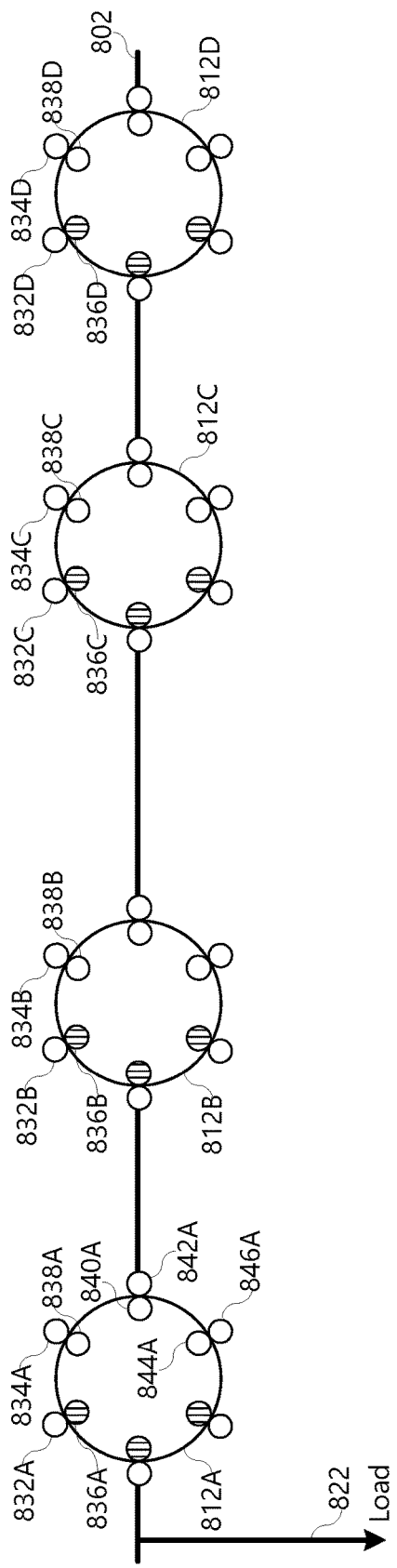
Figure 8A
Figure 8B

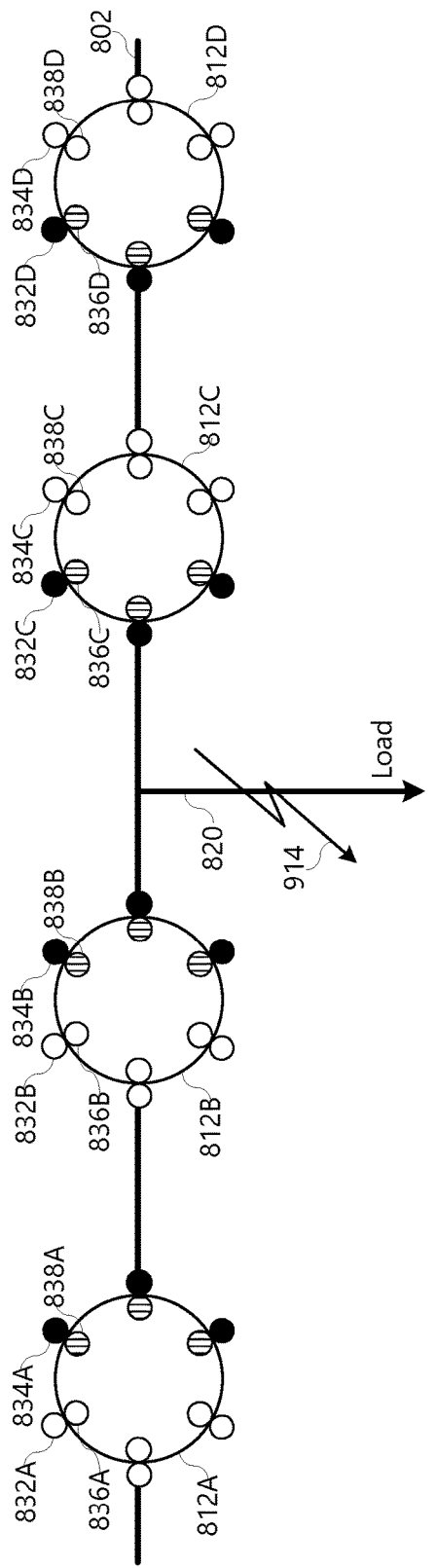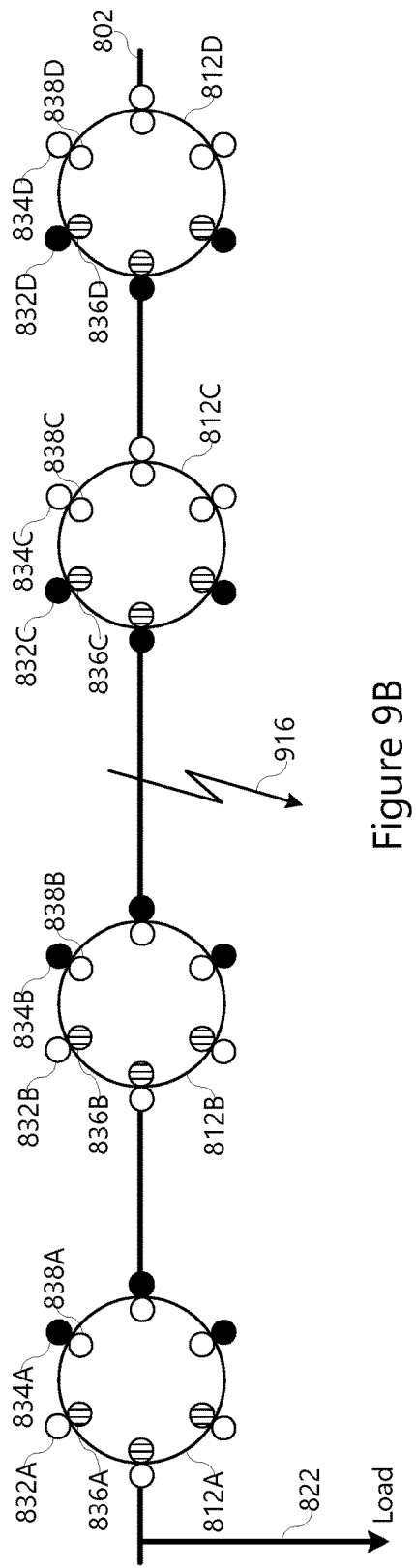

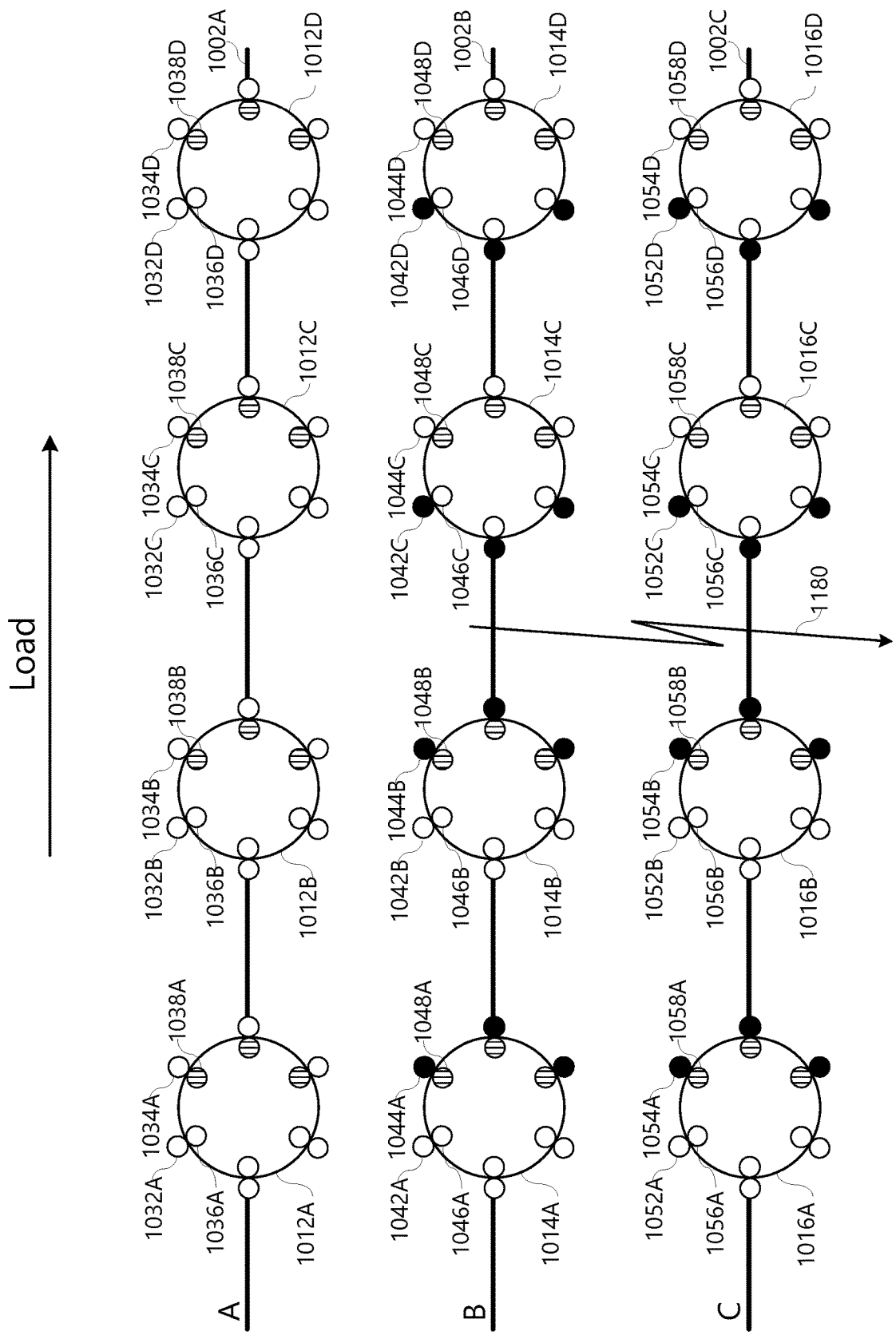

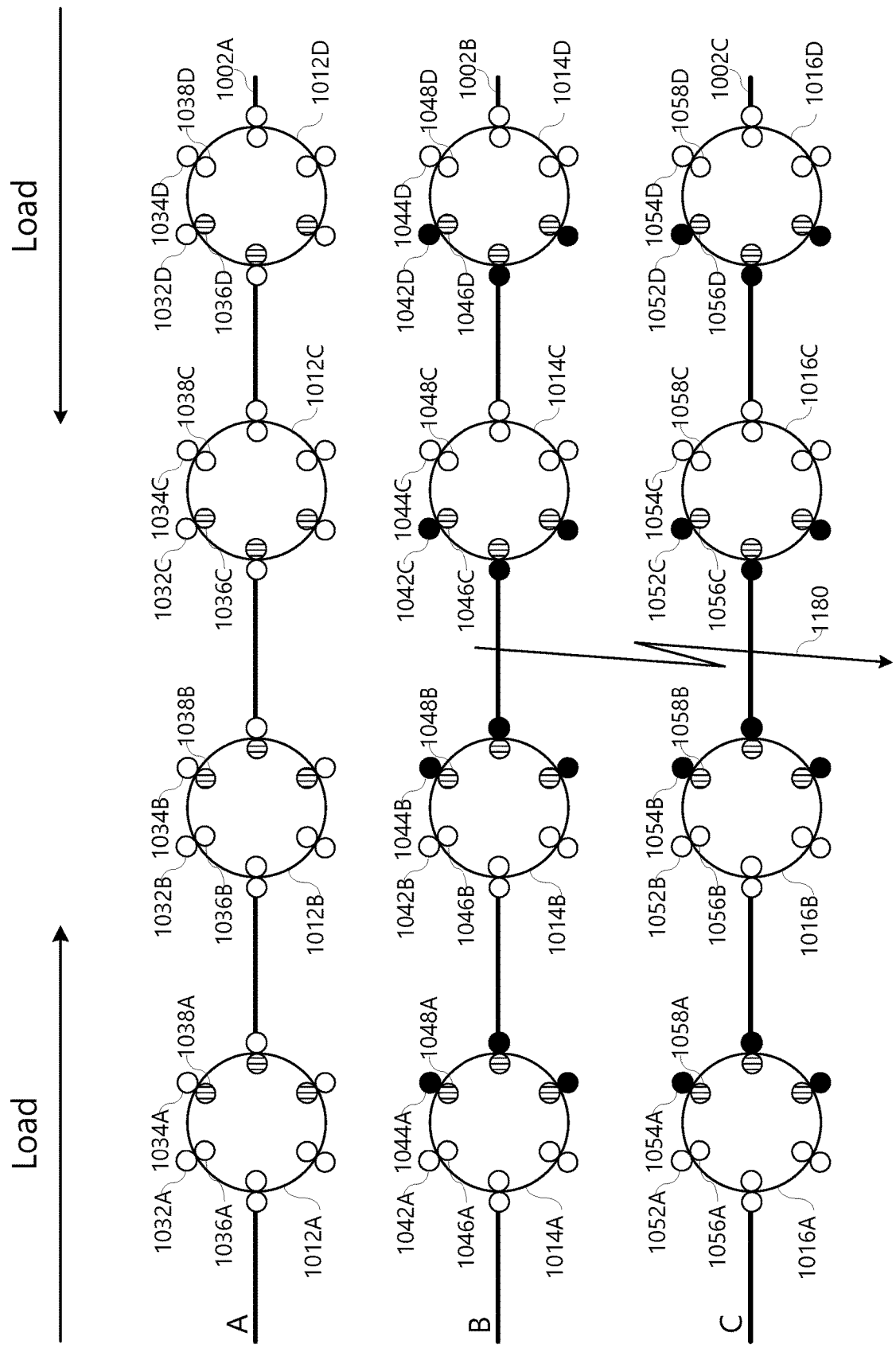

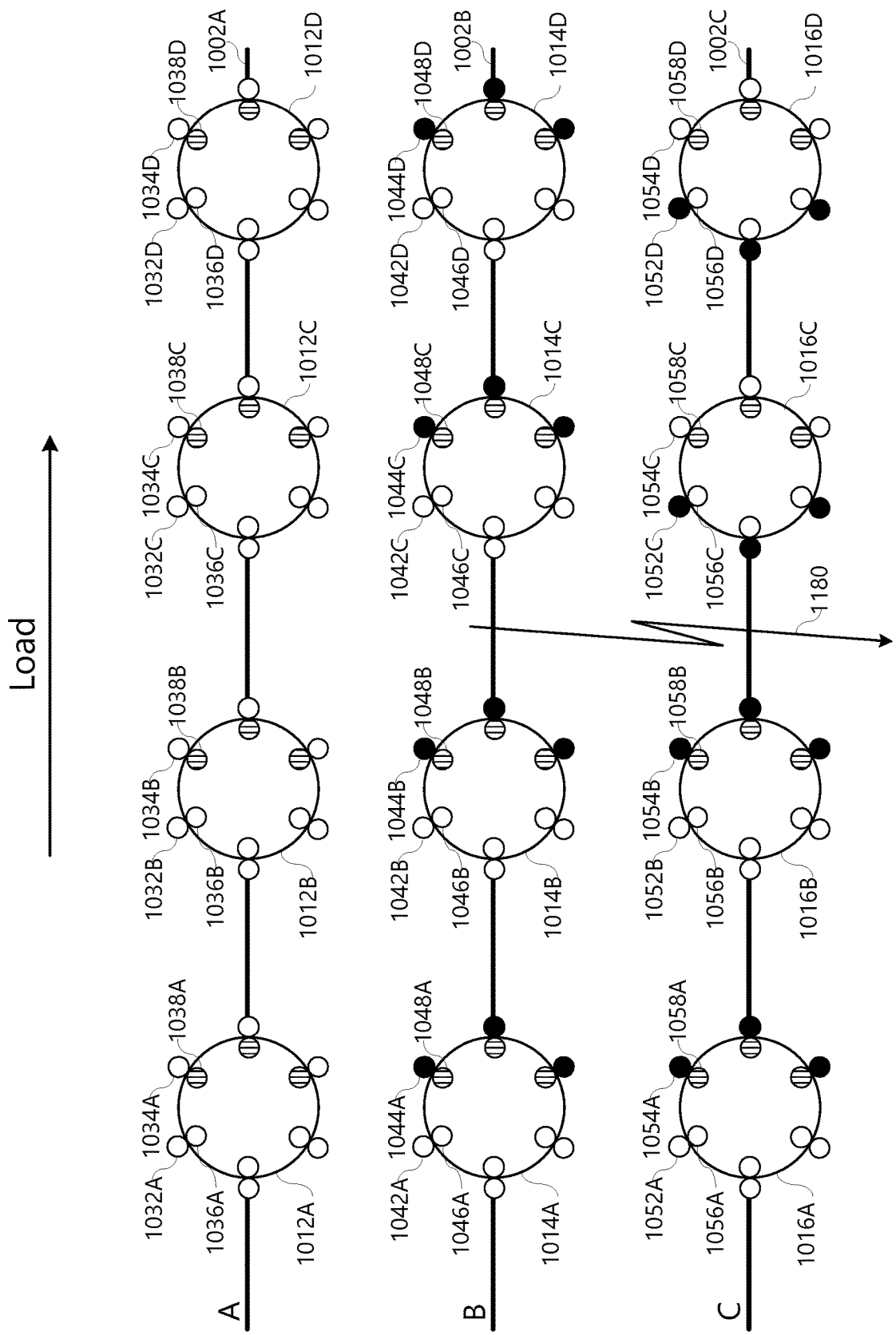

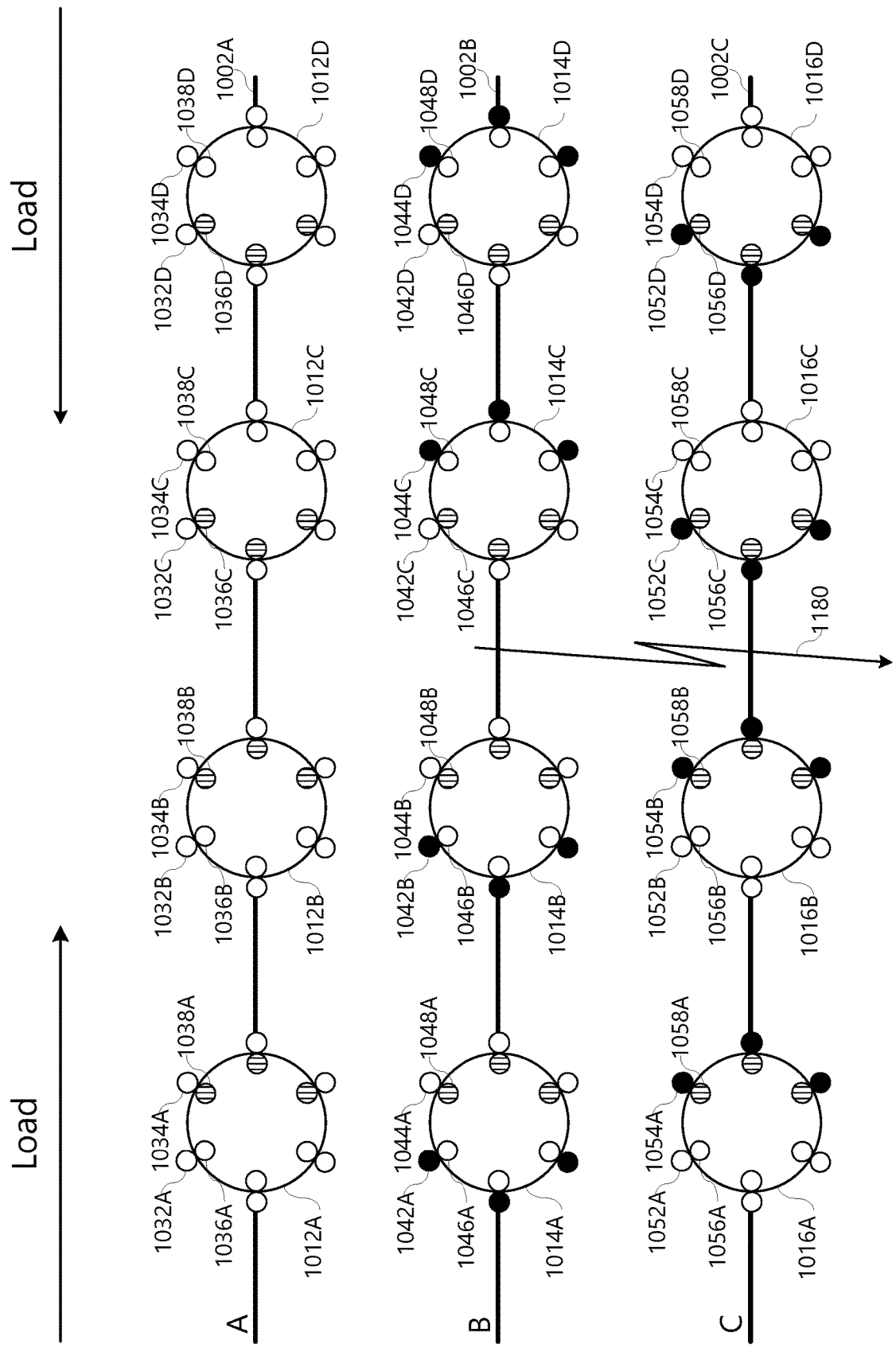

FAULT DIRECTION CALCULATION DURING CURRENT TRANSFORMER SATURATION

RELATED APPLICATION

None.

TECHNICAL FIELD

This disclosure relates to calculating a direction to a fault on an electric power delivery system. More particularly, this disclosure relates to calculating the direction to the fault during current transformer saturation. This disclosure also relates to displaying a fault direction on a line-mounted device during current transformer saturation.

BRIEF DESCRIPTION OF THE DRAWINGS

Non-limiting and non-exhaustive embodiments of the disclosure are described, including various embodiments of the disclosure with reference to the figures, in which:

FIGS. 8A and 8B illustrate series of line-mounted devices indicating a direction to a load on different conductors.

FIGS. 9A and 9B illustrate series of line-mounted devices indicating directions to loads and directions to faults on different conductors.

FIGS. 11A, 11B, 11C, and 11D illustrate a series of line-mounted devices on a three-phase electric power delivery system under a phase-to-phase fault or a phase-to-phase-to-ground fault and indications of load direction and fault direction by the line-mounted devices.

DETAILED DESCRIPTION

Figure 1:
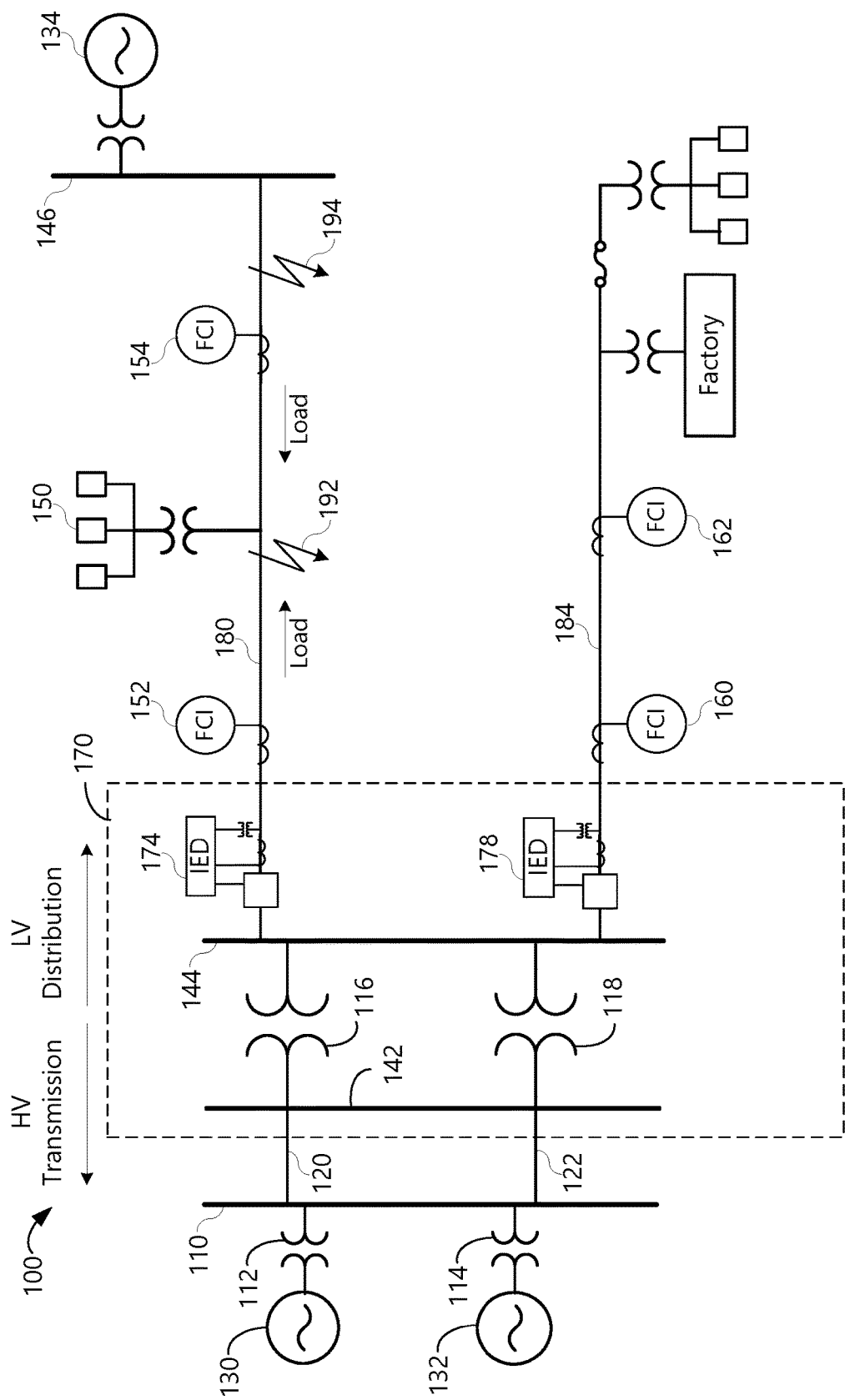
FIG. 1 illustrates a simplified one-line diagram of an electric power delivery system.

Electric power delivery systems are used throughout the world to generate, transmit, and distribute electric power to loads for consumption. Intelligent electronic devices (IEDs) may be used to obtain and process information from the electric power delivery system, perform monitoring and protection functions, and effect control operations on the electric power delivery system equipment. Typically, IEDs are located at substations and near major equipment.

To improve the data gathering, monitoring, and protection of the electric power delivery system, line-mounted devices may be used to obtain electric power system measurements and provide measurements and information to IEDs and supervisory systems. Measurements and electric power delivery system information from line-mounted devices may be used by IEDs to improve monitoring and protection of the electric power delivery system. For example, a line-mounted device may obtain current measurements during a fault condition. The line-mounted device may detect the fault, and report the fault condition along with a fault magnitude to the IEDs or supervisory system. IEDs or the supervisory system may use fault magnitude to determine a more accurate fault location. Indeed, an IED may provide a better estimation of the fault location using a fault magnitude from a line-mounted device nearer to the fault than a fault magnitude obtained from the location of the IED.

Further, line-mounted devices may assist line crews to find the fault location. Line-mounted devices may include a visual indicator to show that a fault has been detected or a fault has not been detected. For example, line-mounted device may include a colored target or illumination (via, e.g. a light-emitting diode (LED)) that indicates detection of a fault. Line crews may visually inspect the line-mounted devices to determine if the fault is on the line. However, simple indications are not sufficient to indicate to a line crew a direction to the fault. Accordingly, upon encountering a line-mounted device indicating a detected fault, a line crew would not know which direction along the line to investigate in order to find the fault.

Line-mounted devices may obtain electric power current measurements from the line using CTs. CTs used be line-mounted devices may be constrained by requirements related to size, power consumption, weight, and the like. Accordingly, CTs used by line-mounted devices may saturate when the current exceeds the nominal current for the portion of the electric power delivery system where the line-mounted device is applied or when current approaches a fault current magnitude.

Accordingly, what is needed is a line-mounted device that calculates a direction to a fault, and provides an indication of the direction to the fault. Furthermore, what is needed is a line-mounted device that provides accurate fault direction calculation and indication during CT saturation. Also, what is needed is a line-mounted device that provides accurate fault direction indications calculation while reducing power consumed by the line-mounted device. The disclosure herein presents line-mounted devices and methods to calculate and indicate a direction to a fault, which operate even during CT saturation.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an electric power delivery system 100. Electric power may be generated by generation sites 130, 132, which supply electric power to a transmission bus 110 via transformers 112, 114. Electric power may be transmitted via transmission lines 120, 122 to bus 142 at substation 170. Transformers 116, 118 may reduce voltage of the electric power from bus 142 to distribution bus 144. Feeders 180 and 184 may distribute electric power from distribution bus 144 to various loads.

Although not separately illustrated, various of the electric power delivery system equipment may be monitored or protected by various IEDs. For example, generators may be monitored and protected by generator IEDs. Transformers, buses, transmission lines, and the like may be monitored and protected by respective IEDs. Feeder 180 may be monitored and protected using IED 174, which obtains electric power signals from feeder 180 using CTs, PTs, and the like; and may effect control of the electric power system by control of a circuit breaker. Similarly, feeder 184 may be monitored and protected using IED 178.

To improve the monitoring and protection of feeders 180 and 184, line-mounted devices 152, 154, 160, and 162 may be used on feeders 180 and 184. Line mounted devices may obtain electric power signals from feeders 180 and 184 using, for example, CTs. Upon obtaining electric power signals, line mounted devices may sample a secondary signal from CTs, determine a fault condition, determine a fault current magnitude, and wirelessly transmit information such as current, fault current magnitude, and the like to IEDs 174 and 178 according to the embodiments herein described.

Load center 150 may be fed by electric power from bus 144 as well as from bus 146, which receives electric power from, for example, generator 134. Although a single load center 150 is illustrated as receiving electric power from feeder 180, various other taps and load centers may receive power using, and be electrically connected to feeder 180. To determine a location of a fault on the feeder 180 and/or on the load center 150, line mounted devices 152, 154 may be configured as described herein to determine a direction of power flow (or direction to the load) as is indicated by the illustrated arrows to the load.

Possible faults 192 and 194 may be detected by line mounted devices 152 and 154. As can be seen, if line mounted devices merely indicated a fault detection, upon encountering one of the line mounted devices 152 or 154, a line crew would not be able to tell where along the line the fault was. As disclosed herein, line mounted devices 152, 154 may determine and indicate a direction to a fault so that a line crew may be able to determine a location of a fault relative to the line mounted device. Furthermore, the line mounted devices 152, 154 as disclosed herein may be able to determine a direction to a fault relative to the direction of power flow (load direction).

Figure 2A:
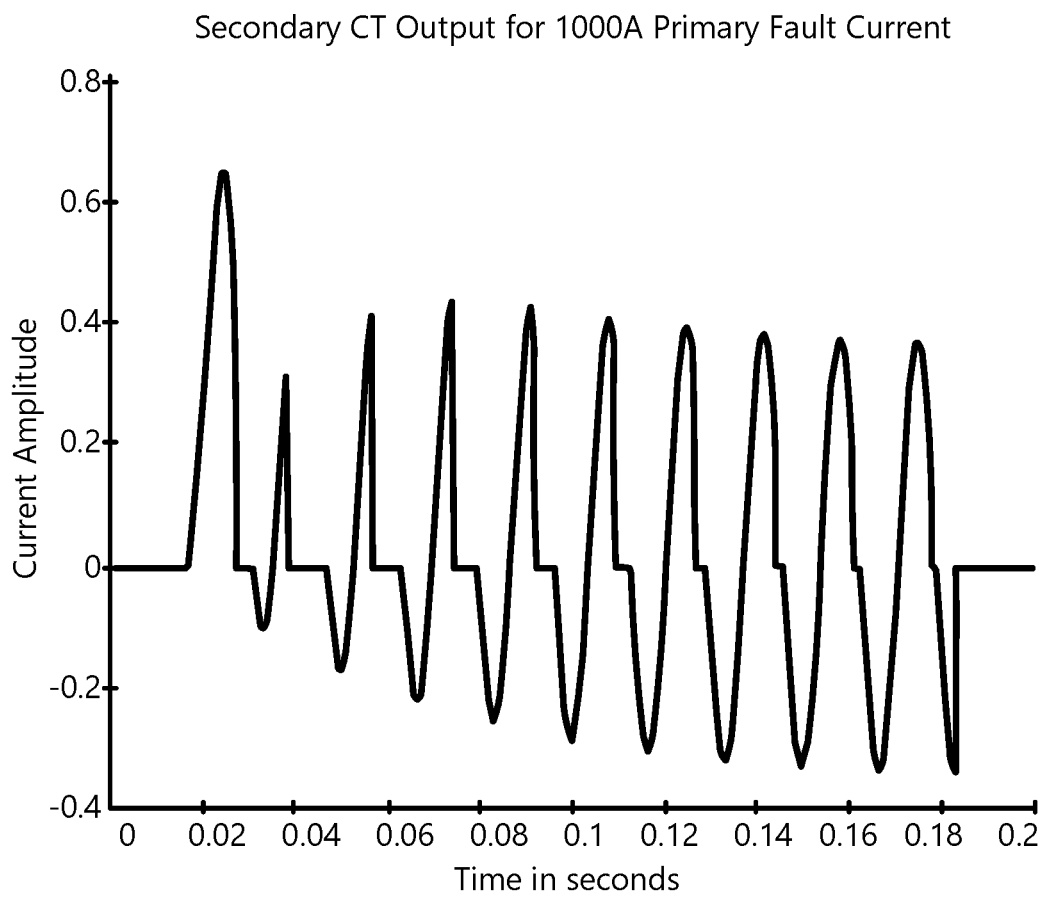
FIGS. 2A and 2B illustrate secondary current signals from a current transformer (CT) during saturation.
Figure 2B:
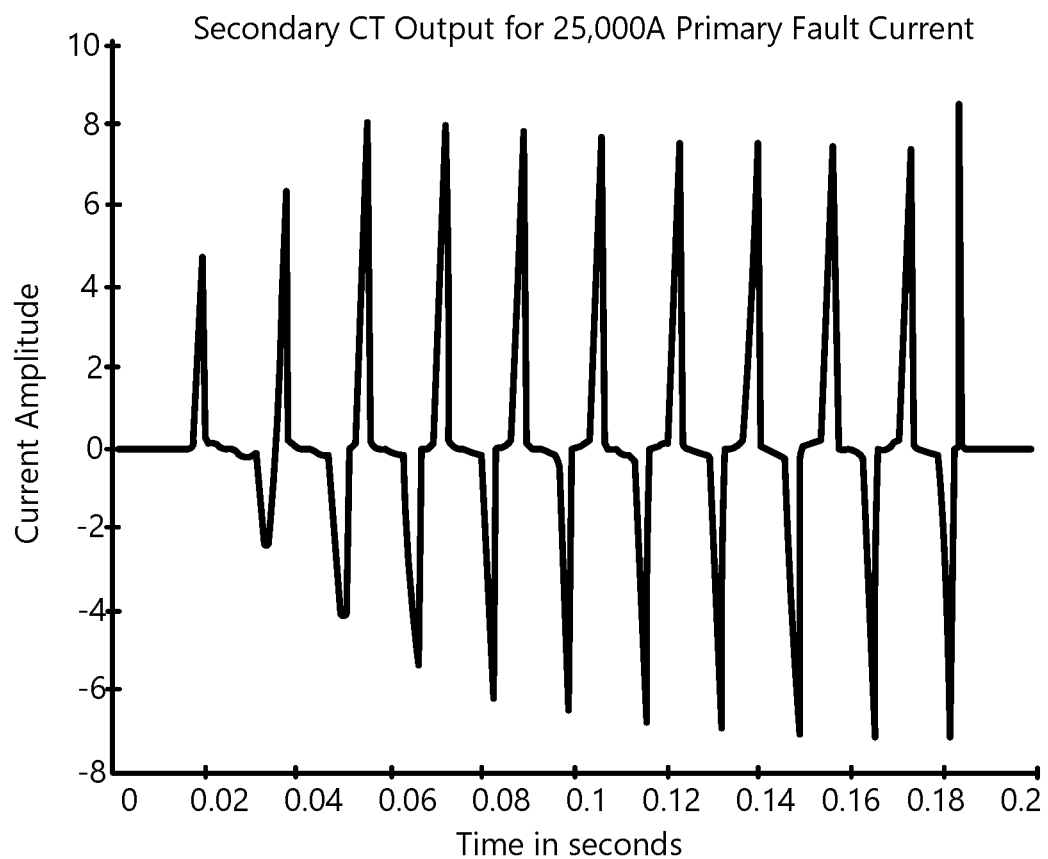

As suggested above, line-mounted devices often include CTs that may saturate under current conditions that exceed the nominal current condition of the electric power delivery system or approaches fault current magnitude. FIG. 2A illustrates a plot of a secondary current signal from a saturated CT of a line-mounted device during a 1000 A primary fault condition. As can be seen, the CT saturates leading to a distorted current signal. Similarly, FIG. 2B illustrates a plot of a secondary current signal from a saturated CT of a line-mounted device during a 25,000 A primary fault condition. The evidence of saturation of the CT is even more evident than the saturation illustrated in FIG. 2A given the distortion present in the secondary signal. Clearly, the sinusoidal current waveform is not represented by the current secondary from the saturated CT.

Figure 3:
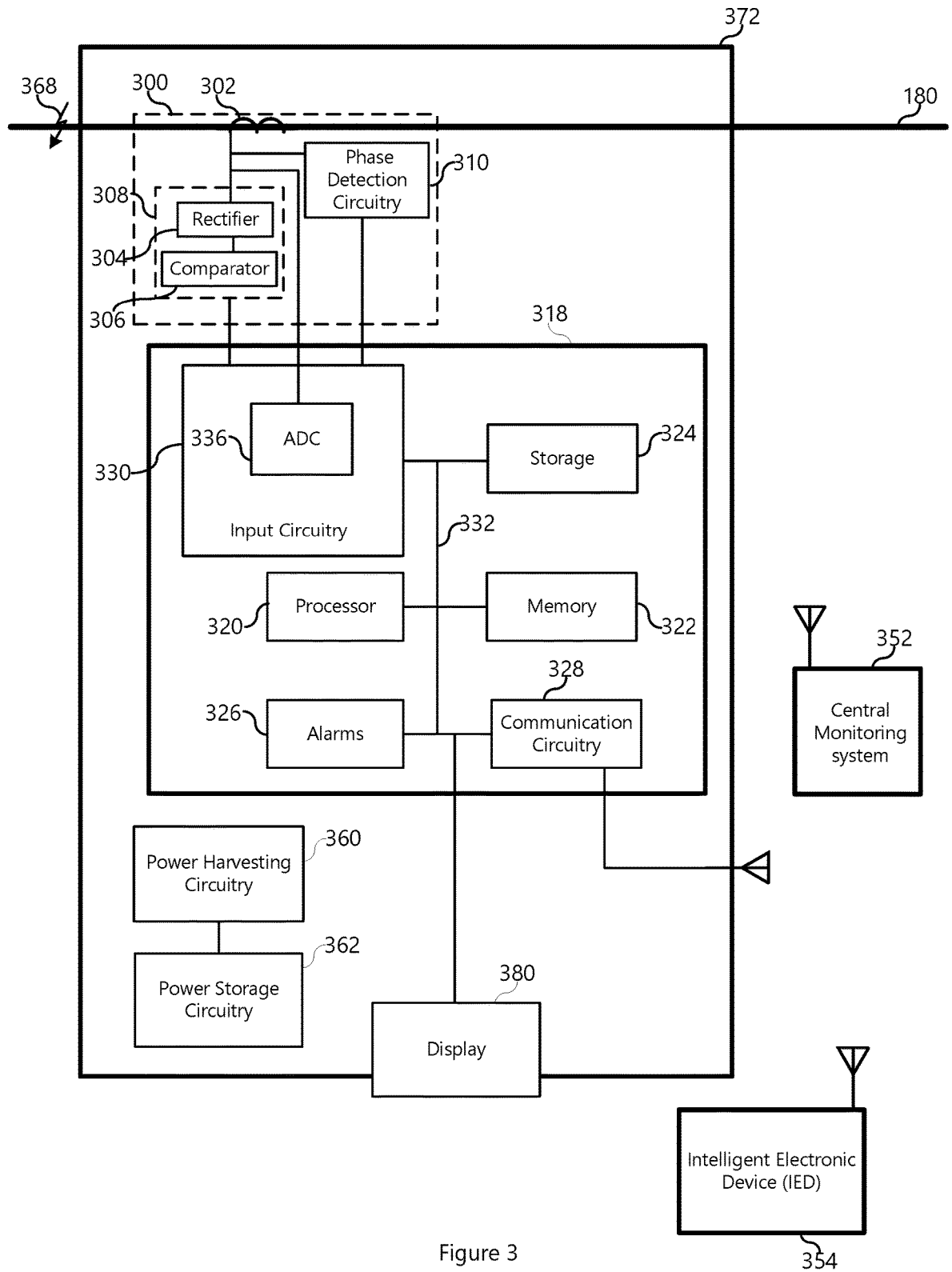
FIG. 3 illustrates a simplified block diagram of a line-mounted sensor according to several embodiments herein.

FIG. 3 illustrates a simplified block diagram of a line-mounted device 372 that may obtain measurements from feeder 180 (such as current, voltage, or the like), and determine a direction to a fault even under saturated CT conditions according to several embodiments herein. The line-mounted device 372 may refer to any of the line-mounted devices 152, 154, 160, or 162 discussed above. The line-mounted device 372 may include sensor circuitry 300 configured to obtain a current signal from the feeder 180. The sensor circuitry 300 may include one or more CTs 302 operatively coupled to the feeder 180 such that current through the feeder 180 induces current through the CT 302 proportional to current through the feeder 180 under unsaturated conditions. When the CT saturates, the secondary current (through CT 302) is no longer proportional to the primary current (through the feeder 180). The sensor circuitry 300 may further include threshold detection circuitry 308 and phase detection circuitry 310. The threshold detection circuitry 308 may have a rectifier 304 that rectifies the current signals from the CT 302 and a comparator 306 electrically coupled to an output of the rectifier 304. The comparator 306 may compare the rectified signal to a threshold to detect an occurrence of an event such as fault 368. As suggested herein, the CT may provide an accurate secondary current signal during nominal conditions but a distorted secondary current signal during saturated conditions (such as, for example, during an overcurrent condition).

The line sensor 372 may include a controller 318, such as a microcontroller, having one or more processor(s) 320, memory 322 and/or nonvolatile storage 324, one or more alarms 326, communication circuitry 328, input circuitry 330, or any combination thereof. Each of the processor 320, the memory 322, the storage 324, the alarms 326, the communication circuitry 328, and the input circuitry 330 may be communicatively coupled by one or more communication busses 332. In the illustrated embodiment, the input circuitry 330 may receive the output from the comparator 306. For example, the comparator 306 may output a digital signal to the input circuitry 330 based on the comparison between the threshold and the rectified signal to indicate the occurrence of the event 368.

In the illustrated embodiment, the line mounted sensor 372 includes one or more analog to digital (A/D) converters 336 that receive an analog signal from the current transformer 302 or another current transformer and convert the analog signal into a digital signal. The A/D converter 336 may multiplex, sample, and/or digitize the measured current and/or voltage signals to form corresponding digitized current and/or voltage signals. For example, the A/D converter 336 may monitor an analog signal indicative of the operating parameter on the feeder 180 and output a digital signal representing the operating parameter on the feeder 180.

The processor 320 and/or other data processing circuitry may be operably coupled with the memory 322 and/or the nonvolatile storage 324 to perform various operations. Such programs or instructions executed by the processor 320 may be stored in any suitable article of manufacture that may include one or more tangible, computer-readable media at least collectively storing the instructions or routines, such as the memory 322 and the nonvolatile storage 324. The memory 322 and the nonvolatile storage 324 may include any suitable articles of manufacture for storing data and executable instructions, such as random-access memory, read-only memory, rewritable flash memory, hard drives, or any other suitable optical, magnetic, or solid-state storage medium, or a combination thereof.

In some embodiments, the processor 320, the memory 322, and/or the nonvolatile storage 324 may be implemented as hardware components, such as via discrete electrical components, via a field programmable gate array (FPGA), and/or via one or more application specific integrated circuits (ASICs). The processor 320 may be embodied as one or more general-purpose microprocessors, one or more special-purpose microprocessors, a general-purpose integrated circuit, an ASIC, an FPGA, and/or other programmable logic devices.

The input circuitry 330, such as the A/D converter 336, may be operatively coupled to the processor 320 (e.g., via the communication bus 332 or another bus), through which digitized representations of current and/or voltage signals may be transmitted to the processor 320. The processor 320 may analyze the event 368 based on the digitized representations of current using instructions stored in the memory 322. The processor 320 may then provide a signal indicating the occurrence of the event 368. In certain embodiments, the processor 320 may send a signal to the alarm 326 to indicate the event 368 occurrence. The alarm 326 may provide an audio alert, a visual alert (e.g., LEDs), or the like. The processor 320 may send a signal to the communication circuitry 328 to output a wireless signal to an electronic device to indicate that the event 368 has occurred or is ongoing. In some embodiments, the communication circuitry 328 may include a transceiver that receives and/or transmits data to enable the processor 320 to communicate with other electronic devices. For instance, the processor 320 may communicate, via a communication network with a central monitoring system 352, such as a supervisory control and data acquisition (SCADA) system and/or a wide area control and situational awareness (WACSA) system. The central monitoring system 352 may provide protective operations for the power transmission and distribution system.

The processor 320 may communicate, via a communication network and/or via direct radio signals sent by the transceiver, with one or more intelligent electronic devices (IEDs) 354. The IED 354 may be remote from the central monitoring system 352 and may communicate directly or over the communication network with the central monitoring system 352 and/or one or more other IEDs.

The line-mounted device 372 may include a display 380 in communication with bus 332 and configured to provide a visual indication of the fault detection, the direction of the load and/or the direction to the fault. As disclosed in more detail herein, the processor may execute instructions to determine a direction to the load and direction to the fault using signals from the sensor circuitry 300. Upon detection of a fault, the processor may signal the display 380 to provide a visual indication of a fault detection. Further, upon determination of a direction of the load and a direction to the fault, the processor 320 may signal the display to provide a visual indication of the direction of the load and/or a direction to the fault. The display 380 may include a flag or other visual indicator. The display 380 may include one or more illuminating components such as light-emitting diodes (LEDs), lamps, or the like capable of providing a visual indication of a fault, a direction of the load, and/or a direction to the fault. The display 380 may receive electrical power from the power harvesting circuitry 360 and/or the power storage circuitry 362.

In certain embodiments, the line-mounted device 372 may communicate via radio signals with an intermediary device which transmits information to IEDs, SCADA, WACSA, or similar monitoring systems. An intermediate device may be in radio communication with several line-mounted devices, and transmit information therefrom to IEDs, SCADA, WACSA, or similar monitoring systems. The line-mounted device 372 may communicate fault magnitude, load direction, fault direction, and the like.

The line mounted sensor 372 may include power harvesting circuitry 360 (e.g., current transformers coupled to the power line 358, photovoltaic cells, etc.) and/or power storage circuitry 362 (e.g., battery cells, capacitors, supercapacitors, and the like) to store, for example, the harvested energy. Electric power for the energy harvesting circuitry 360 may be obtained using CT 302. The power harvesting circuitry 360 and/or the power storage circuitry 362 may provide power to the line sensor 372 to enable the line sensor 372 to monitor the feeder 180 and provide an indication of the event 368.

The line sensor 372 may be a wireless line sensor that is powered with the power harvesting circuitry 360 and/or the power storage circuitry 362. The power harvesting circuitry 360 of wireless line sensors may be limited in which the line sensor 372 is powered via the current transformer 302 or another current transformer without being directly electrically coupled to the power grid. That is, alternating current on the feeder 180 may produce a magnetic field that magnetically induces alternating current in the current transformer 302 (e.g., through a core), harvested by the power harvesting circuitry 360, to power each of the operations of line sensor 372 without additional sources of power other than the power harvesting circuitry 360 and/or the power storage circuitry 362 (e.g., without directly conducting electrical energy via a conductor directly electrically coupled to the power grid). In other embodiments, the power harvesting circuitry 360 may harvest power via photovoltaic cells. The power storage circuitry 362 may include one or more battery cells, capacitors, supercapacitors, or the like, to store energy from the power harvesting circuitry 360 to power the line sensor 372. In some embodiments, the line sensor 372 may perform each of the operations described herein using power from the power harvesting circuitry 360 and/or power storage circuitry 362 without additional power sources.

Because power to perform operations may be limited on the line sensor 372 based on the power harvesting circuitry 360 and/or the power storage circuitry 362, it may be desirable for the line sensor 372 to conserve power. Line sensors that continuously monitor samples (e.g., sampling 3, 4, 5, 10, 20, or more samples within a period) of the current during normal operation may utilize significant power. As described below, embodiments consistent with the present disclosure may improve line sensor technology by determining a fault, a load direction, a fault direction, and/or fault current magnitude of the event without continuously monitoring the current during normal operations (e.g., operations prior to or without an event). By determining a fault direction while limiting power consumption, additional functionality of the wireless line sensor technology may be enabled in which the line sensor 372 provides or stores an indication of the event.

The phase detection circuitry 310 may monitor a feature of the operating parameter, such as changes in the current or voltage. In the illustrated embodiment, the phase detection circuitry 310 may monitor a time at which a feature, such as a zero crossing of the current, a zero crossing of the voltage, a peak (e.g., maximum and/or minimum) of the current, or a peak (e.g., maximum and/or minimum) of the voltage, occurs.

The phase detection circuitry 310 may send an activation signal to activate (e.g., wake up) the controller 318 to enable the controller 318 to store a time stamp associated with each zero crossing. For example, the phase detection circuitry 310 may activate, via hardware interrupts, the controller 318 at each rising edge (e.g., from negative phase to positive phase) and/or falling edge (e.g., from positive phase to negative phase). Upon activation, the controller 318 may record a time stamp associated with the rising edge and/or falling edge and be deactivated until reactivated.

Prior to the event, the controller 318 may be in a sleep mode or in a low power mode, referred to herein as being in a pre-event mode, in which the controller 318 may not measure samples of the magnitude of the current on the feeder 180 to conserve power. That is, the controller 318 may be activated to record time stamps of the zero crossing but may not sample the magnitude of the current or may otherwise be inactive in the pre-event mode. By being activated to record the time stamps of zero crossings (e.g., awake 60 times per second for a 60 hz signal). For example, the controller 318 may begin in an inactive state. Upon occurrence of a zero crossing, the phase detection circuitry 310 may send the activation signal to the controller 318 to activate the controller 320. The processor 320 may record a time stamp of the zero crossing based upon the activation signal and return to being inactive. The controller 318 may repeat this process while operating in the pre-event mode to conserve power by the controller 318 being inactive other than during the zero crossings.

The controller 318 may receive an event signal from the threshold detection circuitry 308 indicating the occurrence of the event 368 due to current exceeding a threshold. The controller 318 may activate upon receiving the event signal and operate in an event mode in which the controller 318 is active, awake, on, or in a high power mode that utilizes more power than the low power mode (e.g., due to being active for longer periods than when active in the pre-event mode) prior to the event. The controller 318 may then measure samples of the current of the feeder 180. In some embodiments, the controller 318 may measure repeated samples (e.g., 8, 16, 32, or more samples), in the event mode, during or following the event 368 to analyze the event 368. That is, the controller 318 may not take any samples of current magnitude prior to the event 368 but may be active to record zero crossings and, upon receipt of the event signal, transition to the event mode and take repeated samples. In other embodiments, the controller 318 may take fewer samples prior to the occurrence of the event 368 than during the occurrence of the event 368. Further, the processor 320 may determine the times at which the zero crossings occurred from the activations by the phase detection circuitry 310 and store the times in the memory 322 and/or nonvolatile storage 324. Based on the zero crossings prior to the event 368 and the repeated samples during or following the event 368, the processor 320 may determine a fault current magnitude of the event 368 even without samples obtained prior to the event, and even under saturated CT conditions. Using the zero crossings of voltage and current prior to the event 368, the processor 320 may determine a direction of the load, and using the signals during and after the event, the processor 320 may determine a direction to the event 368.

Figure 4:
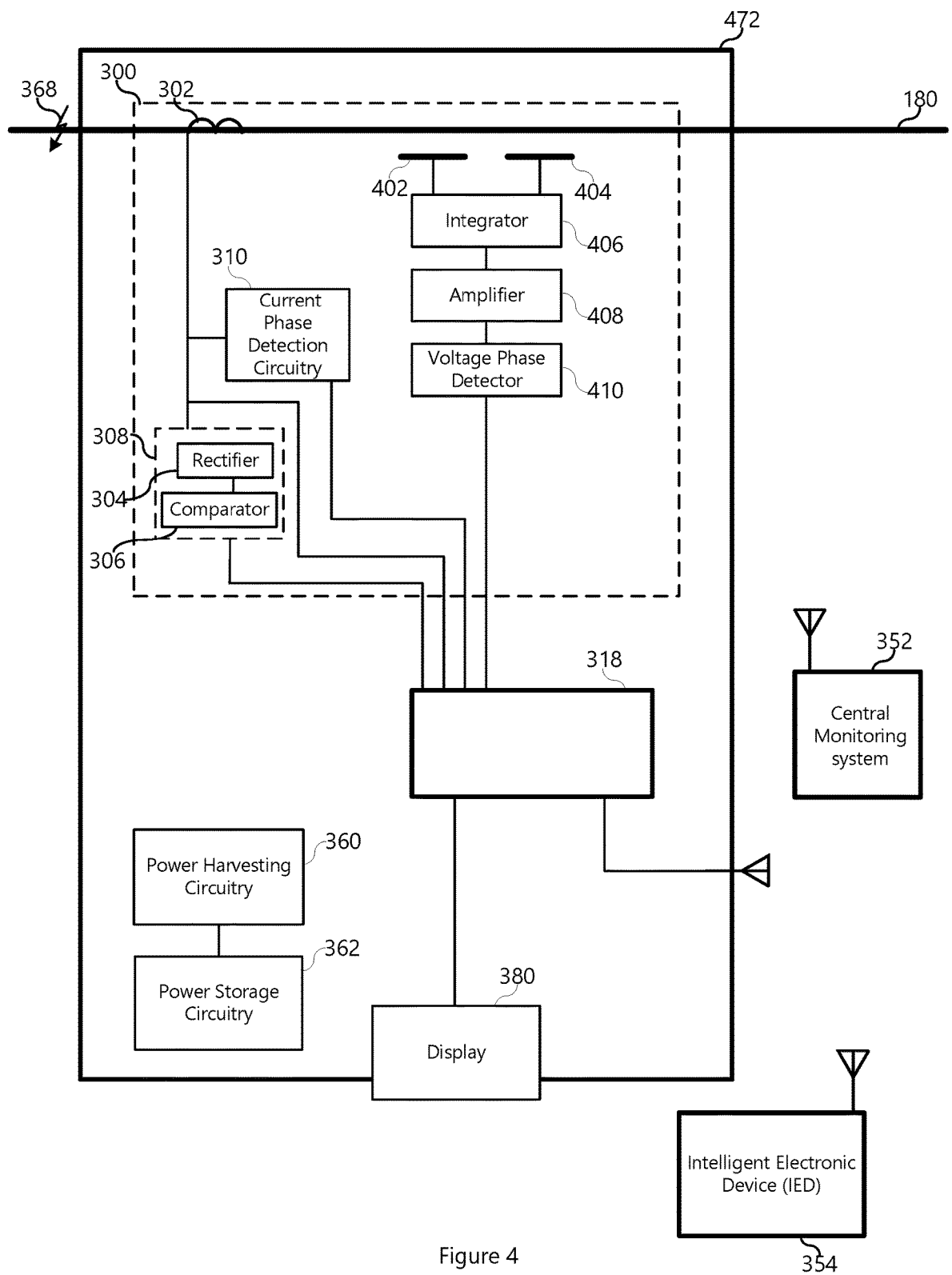
FIG. 4 illustrates a simplified block diagram of a line-mounted sensor with voltage phase detection circuitry according to several embodiments herein.

FIG. 4 illustrates a simplified block diagram of a line-mounted device 472 similar to that illustrated in FIG. 3, with circuitry capable of obtaining a voltage signal from the conductor 180, detecting a phase and detecting voltage signal zero crossings. In particular, the line-mounted device 472 includes sensor circuitry 300 that includes two separate conductive plates 402 and 404 at a distance from conductor 180. The conductive plates 402 separated by a distance from the conductor 180 results in a first capacitance between the conductor 180 and first plate 402, and a second capacitance between the conductor 180 and second plate 404. One of the first or second plates 402 or 404 may be a circuit board and not separately embodied as a plate. The first and second plates 402, 404 are in electrical communication with integrator 406, which integrates the current resulting from the first and second capacitances between first and second plates 402, 404 and conductor, to produce a voltage signal. The voltage signal is amplified by amplifier 408. The amplifier 408 may also shift the voltage signal so that the maximum and minimum peaks are positive. The voltage phase detector 410 may determine zero crossings of the amplified and shifted voltage signal. In one embodiment, the voltage phase detector 410 may signal a phase change in the voltage signal when the voltage signal crosses over a value that is halfway between high and low peaks of the voltage signal. The voltage phase detector 410 may provide a binary signal depending on the phase of the voltage signal. For example, when the voltage signal is above the halfway value, the voltage phase detector 410 may provide a high or one value; and when the voltage signal is below the halfway value, the voltage phase detector 410 may provide a low or zero value. As with the current signal, the controller 318 may record times of zero-crossings of the voltage signal. The times of voltage signal zero crossings may be used together with times of current signal zero-crossings to determine a direction of the load as further described herein.

Although a particular voltage phase detection circuitry is described and illustrated, any suitable embodiments for obtaining a voltage signal or voltage phase changes may be used.

As is illustrated and described, line-mounted devices may be installed in a somewhat distributed manner on conductors in an electric power delivery system. The line-mounted devices may monitor current on the conductor, determine current levels, determine fault conditions, and communicate such information back to an IED or supervisory system either directly or indirectly through intermediary devices, communication networks, and the like. Furthermore, line-mounted devices may be configured to operate using electric power harvested from the conductor, onboard power sources, or the like. To conserve electric power for operation, the line-mounted device may be configured to reduce the amount of electric power used by its various components. To that end, the line-mounted device may be configured to operate with the processor in a low-power mode unless certain conditions are detected. As illustrated in FIGS. 3 and 4, the line-mounted device may use sensor circuitry to determine phase, compare current magnitude to a threshold, filter the current signal, and the like. The processor 320 may be activated to record time stamps of zero crossings determined by the phase detection circuitry 310. The processor 320 may be activated upon determination of a fault condition by the comparator 306, at which time the processor may be active to record sampled current signals, determine fault conditions, determine a direction to the fault, determine a fault magnitude, load direction, direction to the fault, effect communication, indicate using a display, and the like. Otherwise, the processor 320 may remain in low-power or pre-event mode without continuously sampling the current signal.

Figure 5:
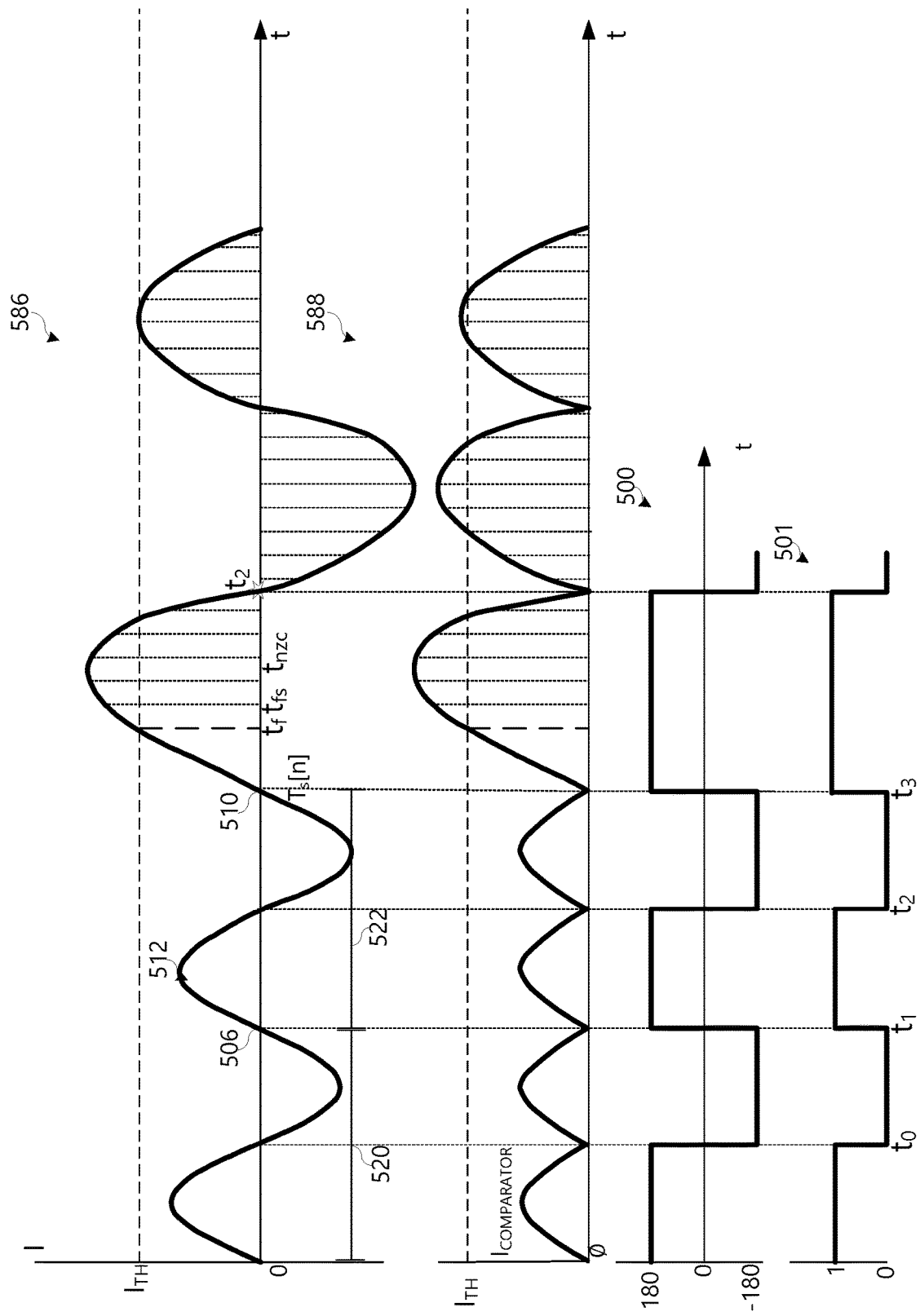
FIG. 5 illustrates current and data plots in accordance with several embodiments herein.

FIG. 5 illustrates plots of signals during different time periods and stages of a line-mounted device. The set of graphs in are meant to be illustrative of concepts consistent with embodiments of the disclosure, and while the graphs are depicted visually, the line sensor 372 may process data from the sensor circuitry 300 and/or the phase detection circuitry 310 without generating the visual depiction of the graphs.

A first graph 586 shows current measurements obtained at the current sensor circuitry 300 representative of current through the power line 180 with respect to time. A second graph 588 illustrates the rectified current obtained at the comparator 306 to detect the occurrence of the event 368. A third graph 500 shows a signal analyzed via the phase detection circuitry 310 used to activate the controller 318 to obtain the time stamps of the zero crossings. A fourth graph 501 shows an activation signal sent from the phase detection circuitry 310 to the controller 318 to record the time stamps of the zero crossings. The phase detection circuitry 310 may detect the times at which the phase alternates directions at time stamps $t_0$, $t_1$, $t_2$, and $t_3$. Each of the time stamps $t_0$, $t_1$, $t_2$, and $t_3$ may be stored in memory 322 and/or the nonvolatile storage 324 the controller 318. In an embodiment, the phase detection circuitry 310 may send the activation signal to activate the controller 318 at each rising edge at time $t_1$ and $t_3$. In another embodiment, the phase detection circuitry 310 may send the activation signal to activate the controller 318 at each falling edge at time $t_0$ and $t_2$.

In the illustrated embodiment, upon detecting that the current exceeds the threshold, the line-mounted device may detect an overcurrent fault, and determine the fault magnitude for transmission to an IED or supervisory system such that additional aspects of the fault may be determined. As described above, the CT may become saturated, such that the fault magnitude cannot be measured directly using the secondary signals therefrom. To determine the direction to the fault even during CT saturation, the line-mounted device may: 1) time stamp zero crossing of the pre-event current and determine the power system period and frequency; 2) when the current magnitude exceeds a predetermined threshold, time stamp the instant that the threshold is crossed, and start sampling the current; 3) calculate load direction; 4) calculate the first maximum peak and minimum peak of the sampled waveform; 5) find the maximum or minimum peaks (depending on step 3) and find the unsaturated region of samples depending on the maximum or minimum peaks; 6) determine data pairs of samples within the unsaturated regions in consecutive cycles; 7) determine direct current (DC) component parameters; 8) remove DC components from the samples; 9) recreate primary fault current waveform with DC components removed; 10) calculate an angle of primary fault current waveform with the pre-fault current; 11) calculate the direction to the fault with respect to the direction to the load using the angle; and 12) communicate and/or display the fault direction.

In accordance with several embodiments, the line-mounted device may continuously time stamp zero crossings of the voltage and the current during the pre-fault condition, and store the last five time stamps of both voltage and current zero crossings. Pre-fault voltage zero crossings may be represented herein by: $t_{s\_v}$, while pre-fault current zero crossing may be represented herein by: $t_{s\_i}$.

The line-mounted device may determine a power system period and frequency using the voltage or current zero crossing times. For example, the processor 320 may retrieve the time stamps $t_1$ and $t_3$ of rising zero crossings of the pre-event current 512 from the memory 322 and/or the non-volatile storage 324. The processor 320 may determine a period (or frequency) 520 and 522 of the pre-event current 512 based on the time stamps $t_1$ and $t_3$ the rising edge zero crossings 506, and 510. In an embodiment, the processor 320 may utilize a moving average filter to determine the period 520 and 522. For example, a low pass filter (which may be implemented in the processor 320, or may be implemented in hardware in, for example, the input circuitry 330) having a moving average of time between each of the rising zero crossings may be implemented according to Equation 1:

$$T_{average}[n] = \frac{1}{5}(t_s[n] - t_s[n-4]) \qquad \text{Eq. 1}$$

-continued $$f = \frac{1}{T_{average}[n]}$$

where t$_s$ represents the time stamps of the rising edge voltage or current zero crossings of the nth sample. Note that while rising edge zero crossings are used as an example, falling edge or a combination of both may be used. Note also that although a five-point moving average filter is implemented, more or fewer zero-crossing times may be used in appropriate filters to determine the average.

The line-mounted device may use the voltage and current zero-crossing times to determine a direction of the load. To do this, the voltage and current zero-crossing times are compared. In one specific embodiment, the line-mounted device may perform the comparison using thresholds TD1, TD2, TD3, and TD4 calculated using Equations 2-5:

$$TD1 = \frac{90}{f/360} \quad \text{Eq. 2}$$

$$TD2 = \frac{270}{f/360} \quad \text{Eq. 3}$$

$$TD3 = \frac{1}{f} \quad \text{Eq. 4}$$

$$TD4 = \frac{180}{f/360} \quad \text{Eq. 5}$$

Direction of the load may then be calculated in accordance with Equations 6-10:

| If: | $t_{s\_v}[4] - t_{s\_i}[4] > TD1$ and $t_{s\_v}[4] - t_{s\_i}[4] < 0$ | Then the load current direction is forward and lagging | Eq. 6 |
| If: | $t_{s\_v}[4] - t_{s\_i}[4] > TD3$ and $t_{s\_v}[4] - t_{s\_i}[4] < TD2$ | Then the load current direction is forward and leading | Eq. 7 |
| If: | $t_{s\_v}[4] - t_{s\_i}[4] > TD2$ and $t_{s\_v}[4] - t_{s\_i}[4] < TD1$ | Then the load current direction is reverse | Eq. 8 |
| If: | $t_{s\_v}[4] - t_{s\_i}[4] > TD4$ and $t_{s\_v}[4] - t_{s\_i}[4] < TD1$ | Then the load current direction is reverse and leading | Eq. 9 |
| If | $t_{s\_v}[4] - t_{s\_i}[4] > TD2$ and $t_{s\_v}[4] - t_{s\_i}[4] < TD4$ | Then the load current direction is reverse and lagging | Eq. 10 |

The line-mounted device may be configured to communicate the direction of the load current. As discussed herein, the load current may be communicated via radio frequency to an IED, SCADA, or the like. The line-mounted device may further be configured to display the direction of the load current using the display. In one particular embodiment, the display may include an array of LEDs. The direction of the load current may be displayed using one color of LEDs. For example, LEDs on one side of the sensor in the direction of the load current may be illuminated green. FIGS. 9A-12B, described in more detail hereafter illustrates an embodiment of displays that may be used on line-mounted devices to display a direction of the load.

At time $t_{fs}$ the sensor circuitry 300 may detect an occurrence of the event 368 by determining that measured current has exceeded a current threshold ($I_{TH}$). Upon determining that the measured current exceeds $I_{TH}$, the sensor circuitry 300 may send the event signal to the controller 318 to activate the controller 318 to operate in the event mode from operating in the pre-event mode. The processor 320 may begin repeatedly sampling the fault current for one or more cycles (e.g., 2.5 cycles, 3 cycles, 5 cycles, 6 cycles, 10 cycles, etc.). The processor 320 may obtain the first sample at time $t_{fs}$ according to Equation 11:

$$t_{fs} = t_s[n] + mT_{average}[n] \quad \text{Eq. 11}$$

where $t_s[n]$ is the last time stamp of the zero crossing of current prior to the event;

$T_{average}[n]$ is derived from equation (1); and, m is the smallest integer number in which $t_f < t_{fs}$ where $t_f$ refers to the time at which the current threshold is exceeded, and will be either 1 or 2.

The sampling frequency ($f_{samp}$) selected may depend on the period to obtain a given number of samples per cycle.

TABLE 1

Example sampling frequencies ($f_{samp}$).

| Frequency range (Hz) | | Period range (ms) | | Sampling frequency for 32 samples per cycle (kHz) | Sampling frequency for 64 samples per cycle (kHz) | Sampling frequency for 128 samples per cycle (kHz) |
| --- | --- | --- | --- | --- | --- | --- |
| 64.75 | 65.25 | 15.44 | 15.33 | 2.088 | 4.176 | 8.352 |
| 64.25 | 64.75 | 15.56 | 15.44 | 2.072 | 4.144 | 8.288 |
| 63.75 | 64.25 | 15.69 | 15.56 | 2.056 | 4.112 | 8.224 |
| 63.25 | 63.75 | 15.81 | 15.69 | 2.04 | 4.08 | 8.16 |
| 62.75 | 63.25 | 15.94 | 15.81 | 2.024 | 4.048 | 8.096 |
| 62.25 | 62.75 | 16.06 | 15.94 | 2.008 | 4.016 | 8.032 |
| 61.75 | 62.25 | 16.19 | 16.06 | 1.992 | 3.984 | 7.968 |
| 61.25 | 61.75 | 16.33 | 16.19 | 1.976 | 3.952 | 7.904 |
| 60.75 | 61.25 | 16.46 | 16.33 | 1.96 | 3.92 | 7.84 |
| 60.25 | 60.75 | 16.60 | 16.46 | 1.944 | 3.888 | 7.776 |
| 59.75 | 60.25 | 16.74 | 16.60 | 1.928 | 3.856 | 7.712 |
| 59.25 | 59.75 | 16.88 | 16.74 | 1.912 | 3.824 | 7.648 |
| 58.75 | 59.25 | 17.02 | 16.88 | 1.896 | 3.792 | 7.584 |
| 58.25 | 58.75 | 17.17 | 17.02 | 1.88 | 3.76 | 7.52 |
| 57.75 | 58.25 | 17.32 | 17.17 | 1.864 | 3.728 | 7.456 |
| 57.25 | 57.75 | 17.47 | 17.32 | 1.848 | 3.696 | 7.392 |
| 56.75 | 57.25 | 17.62 | 17.47 | 1.832 | 3.664 | 7.328 |
| 56.25 | 56.75 | 17.78 | 17.62 | 1.816 | 3.632 | 7.264 |
| 55.75 | 56.25 | 17.94 | 17.78 | 1.8 | 3.6 | 7.2 |
| 55.25 | 55.75 | 18.10 | 17.94 | 1.784 | 3.568 | 7.136 |
| 54.75 | 55.25 | 18.26 | 18.10 | 1.768 | 3.536 | 7.072 |

For example, a sampling frequency for a system frequency between 59.75 Hz and 60.25 Hz (i.e., a period of approximately 16.60 ms to 16.74 ms) with 8 samples per cycle may have a sampling frequency of approximately 0.482 kHz. While the table provides example sampling frequencies, these are simply meant to be illustrative and any suitable sampling frequency may be used. The sequence of sampled values at the chosen frequency {$S_m$} may refer to:

$$s_m = s(t_{fs} + mT_{average}[n]) \quad \text{Eq. 12}$$

where m is the integer sample (e.g., m=0, 1, 2, . . . ).

Figure 6:
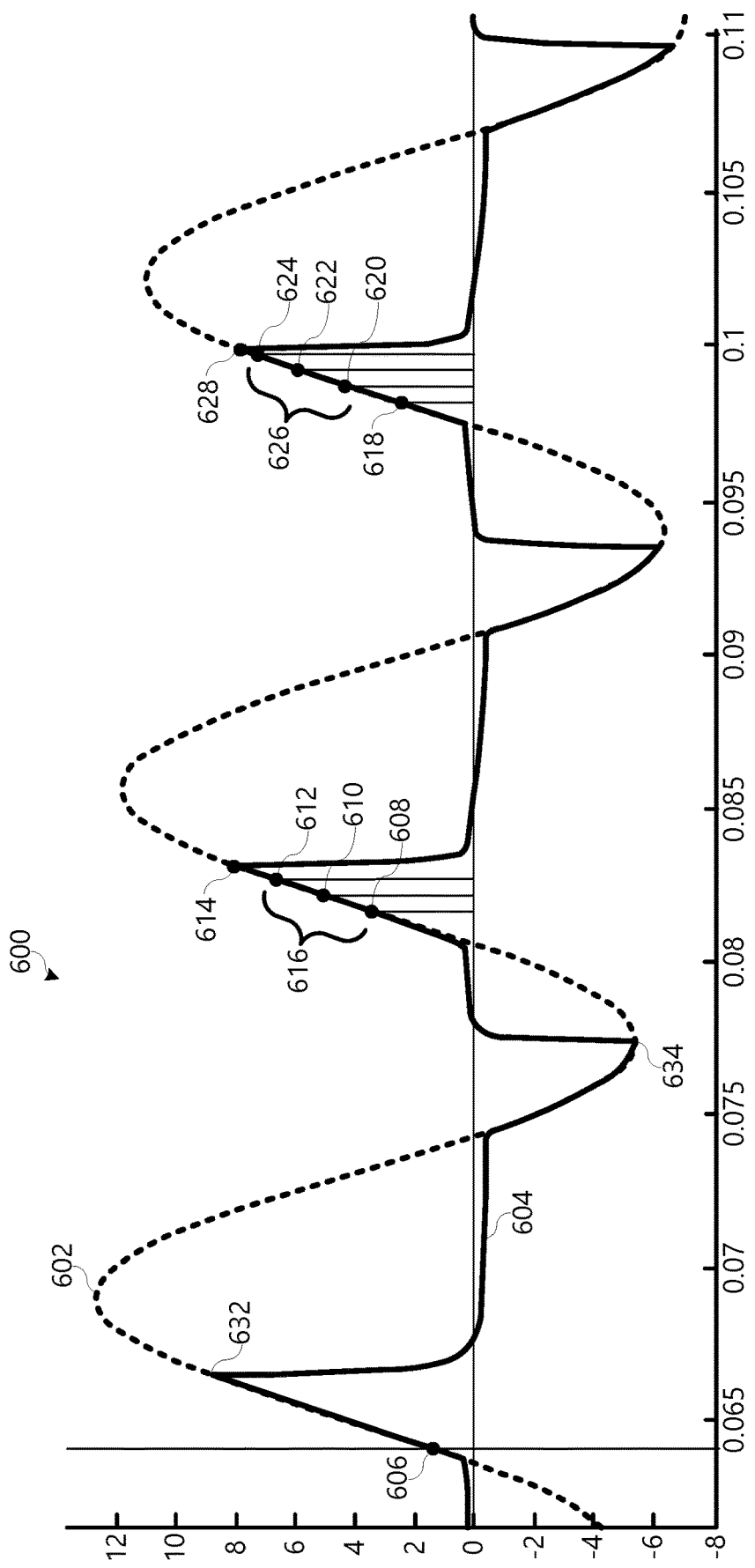
FIG. 6 illustrates a current signal from a saturated CT along with points useful for determining current measurements in accordance with several embodiments herein.

With the sequence of sampled values, the processor may calculate the first maximum peak and minimum peak values of the sampled waveform. FIG. 6 illustrates a current waveform 600 captured by a line-mounted device with a CT that has been saturated by an overcurrent condition. As can be seen, a secondary current without a saturated CT would appear as trace 602. However, due to the CT saturation, the measured secondary current is represented by trace 604. At point 606 an overcurrent condition is detected, the processor enters active mode, and sampling begins. Maximum peak 632 is determined, as is minimum peak 634. The line-mounted device will use samples from either the maximum peaks or minimum peaks depending on the magnitudes thereof. If the first maximum peak has a magnitude greater than that of the first minimum peak, then samples of the maximum peaks will be used. If the first minimum peak has a magnitude greater than that of the first maximum peak, then minimum peaks will be used. In the illustrated embodiment, the first maximum peak has a magnitude greater than the magnitude of the first minimum peak, so the line-mounted device will use samples of the maximum peaks.

The line mounted device may then find the maximum peak values for at least two of the maximum peaks. As illustrated, peaks 614 and 628 are determined as the first two maximum peaks. In the illustrated example, the first illustrated peak 632 may be ignored because the sampling thereof did not start until the current exceeded the threshold at 606. However, various embodiments may include such a first observed peak. The peak samples may be denoted as $S_{m1}$ (614), $S_{m2}$ (628), $S_{m3}$, $S_{m4}$, $S_{m5}$, and so forth.

From the peak values, the samples closest to, for example, 90% of the peak value are found, and referred to herein as unsaturated endpoints. The unsaturated endpoints may be denoted as $n_{me1}$ (612), $n_{me2}$ (624), $n_{me3}$, $n_{me4}$, $n_{me5}$, and so forth. From the peak values, the samples closest to, for example, 50% of the peak value are found, and referred to herein as unsaturated starting points. The unsaturated starting points may be denoted as $n_{ms1}$ (608), $n_{ms2}$ (620), $n_{ms3}$, $n_{ms4}$, $n_{ms5}$, and so forth. The unsaturated starting points and unsaturated endpoints are used to determine the unsaturated regions of the CT. As illustrated the unsaturated region of the first peak includes the region 616 from unsaturated starting point 608 to unsaturated endpoint 612; and the unsaturated region of the second peak includes the region 626 from unsaturated starting point 620 to unsaturated endpoint 624.

It should be understood that the unsaturated region may be determined using different starting points and endpoints. In one embodiment, the unsaturated endpoints are determined as the sample closest to 95% of the peak value. In another embodiment, the unsaturated starting points are determined as the sample closest to 40% of the peak value. Indeed, different combinations of the starting point and endpoint values may be used. For example, an embodiment may use the sample closet to 40% of the peak value for the starting point and the sample closest to 90% of the peak value for the endpoint. Furthermore, different starting point and endpoint values may be used for different peaks of the waveform. For example, in one embodiment, the unsaturated region of the first peak may be determined with a starting point as the sample closest to 50% of the first peak value and an endpoint as the sample closest to 90% of the first peak value; where the unsaturated zone of the second peak may be determined with a starting point as the sample closest to 40% of the second peak value and an endpoint as the sample closest to 95% of the second peak value.

With the unsaturated regions determined, valid data pairs may be selected. A valid data pair is a pair of data points in consecutive cycles, separated by the number of samples per cycle (N) that are each within the respective unsaturated region. That is, a valid pair meets the following criteria: 1) separated by N samples; and 2) each sample in the pair is within its unsaturated region. In the illustrated example, one pair includes points 612 and 622 because the two points are separated by N samples, and each is within its unsaturated region (616, 626). Another pair includes points 610 and 620, as these are separated by N samples, and each are within its unsaturated region (616, 626). However, pair 608 and 618 are not a valid par because, although they are separated by N samples, point 618 is not within its unsaturated region, 626, so the pair is not valid. Accordingly, in the example illustrated in FIG. 6, two pairs are found.

According to several embodiments herein, at least two pairs in consecutive cycles are needed to determine the fault magnitude. As the pairs can come from any consecutive cycles, if the first two cycles do not yield at least two pairs, data samples from additional consecutive cycles may be used. For example, samples from the second and third cycle may be examined to determine if at least two valid pairs are found. Similar determinations may be made for subsequent cycles if needed. It should be noted that by increasing the number of samples per cycle (N), more pairs will be available in each unsaturated region. This will increase the likelihood that at least two valid pairs will be found. For purposes of examples herein, the first set of at least two valid pairs is denoted as $N_{pairs}$. Furthermore, if additional pairs are needed to provide sufficient valid pairs, additional sample points may be calculated by interpolating between recorded sample points in the unsaturated regions.

With at least two valid pairs determined, the pairs of samples may be used to calculate DC components of the saturated signal and to calculate the fault magnitude. This calculation may depend on the number of valid pairs found. If the number of valid pairs is 2 ($|N_{pairs}|=2$), then Equations 13 and 14 may be used to determine $M_1$ and $M_2$:

$$M_1 = \begin{bmatrix} 1 & 1 \\ 1 & 2 \end{bmatrix} \quad \text{Eq. 13}$$

$$M_2 = \begin{bmatrix} \cos(2\pi fT) & \sin(2\pi fT) \\ \cos(2*2\pi fT) & \sin(2*2\pi fT) \end{bmatrix} \quad \text{Eq. 14}$$

where:

$$T = \frac{1}{Nf_{sample}}$$

is the sampling interval;

$M_1$ is a DC component parameter matrix; and, $M_2$ is a fault current magnitude matrix.

For the case with two valid pairs, the two data points may be denoted as $N_{pairs}=\{n_1, n_2\}$: The DC component parameters may be calculated using Equations 15-17:

$$S[n] = s[n] - s[n+N] \text{ if maximum peaks are used} \quad \text{Eq. 15A}$$

$$S[n] = s[n+N] - s[n] \text{ if minimum peaks are used} \quad \text{Eq. 15B}$$

$$S_{M1} = \begin{bmatrix} Ln(S[n_1]) \\ Ln(S[n_2]) \end{bmatrix} \quad \text{Eq. 16}$$

$$D_c = \begin{bmatrix} D_{c1} \\ D_{c2} \end{bmatrix} = (M_1^T M_1)^{-1} M_1^T S_{M1} \quad \text{Eq. 17}$$

The DC fault current component can then be calculated using Equation 18:

$$s_{Dc}[n] = \lambda e^{na} \quad \text{Eq. 18}$$

where:

$$\alpha = D_{C2};$$

$$\lambda = \frac{e^{D_{C1}}}{1 - e^{N\alpha}} \text{ if maximum peaks are used; and,}$$

$$\lambda = \frac{e^{D_{C1}}}{e^{N\alpha} - 1} \text{ if minimum peaks are used.}$$

However, if the number of valid pairs is 3 ($|N_{pairs}|$=3), then Equations 19 and 20 may be used to determine $M_1$ and $M_2$:

$$M_1 = \begin{bmatrix} 1 & 1 \\ 1 & 2 \\ 1 & 3 \end{bmatrix} \qquad \text{Eq. 19}$$

$$M_2 = \begin{bmatrix} \cos(2\pi fT) & \sin(2\pi fT) \\ \cos(2*2\pi fT) & \sin(2*2\pi fT) \\ \cos(3*2\pi fT) & \sin(3*2\pi fT) \end{bmatrix} \qquad \text{Eq. 20}$$

Following the same pattern as in the case of two valid pairs, the three data points may be denoted as $N_{pairs}=\{n_1, n_2, n_3\}$. The DC component parameters may be calculated using Equation 17, and the DC fault current component may be calculated using Equation 18, with $S_{M1}$ may be calculated using Equation 21:

$$S_{M1} = \begin{bmatrix} Ln(S[n_1]) \\ Ln(S[n_2]) \\ Ln(S[n_3]) \end{bmatrix} \qquad \text{Eq. 21}$$

Furthermore, if the number of valid pairs is 4 ($|N_{pairs}|$=4), then Equations 22 and 23 may be used to determine $M_1$ and $M_2$:

$$M_1 = \begin{bmatrix} 1 & 1 \\ 1 & 2 \\ 1 & 3 \\ 1 & 4 \end{bmatrix} \qquad \text{Eq. 22}$$

$$M_2 = \begin{bmatrix} \cos(2\pi fT) & \sin(2\pi fT) \\ \cos(2*2\pi fT) & \sin(2*2\pi fT) \\ \cos(3*2\pi fT) & \sin(3*2\pi fT) \\ \cos(4*2\pi fT) & \sin(4*2\pi fT) \end{bmatrix} \qquad \text{Eq. 23}$$

Following the same pattern as in the case of two valid pairs, the four data points may be denoted as $N_{pairs}=\{n_1, n_2, n_3, n_4\}$. The DC component parameters may be calculated using Equation 17, and the DC fault current component may be calculated using Equation 18, with $S_{M1}$ may be calculated using Equation 24:

$$S_{M1} = \begin{bmatrix} Ln(S[n_1]) \\ Ln(S[n_2]) \\ Ln(S[n_3]) \\ Ln(S[n_4]) \end{bmatrix} \qquad \text{Eq. 24}$$

It should be noted that more valid data pairs may be used, where the DC component parameters and DC fault current components may be calculated following the same pattern as has been described above.

With the DC fault current component, the DC component may be removed from the original samples to obtain a sinusoidal part of the original sampled secondary current signal using Equation 25:

$$s_{AC}[n] = s[n] - s_{DC}[n] \qquad \text{Eq. 25}$$

where $S_{AC}[n]$ represents the original samples with the DC component removed.

Upon obtaining samples with the DC component removed, the fault current magnitude may be calculated. In one embodiment, the sinusoidal waveform ($A_C$) may be calculated in Equations 26 and 27, using the fault current magnitude matrix $M_2$ from the above Equations 14, 20, and 23, depending on the number of valid pairs:

$$S_{M2} = \begin{bmatrix} s_{Ac}[n_1] \\ s_{Ac}[n_2] \end{bmatrix} \qquad \text{Eq. 26}$$

$$A_c = \begin{bmatrix} A_{c1} \\ A_{c2} \end{bmatrix} = (M_2^T M_2)^{-1} M_2^T S_{M2} \qquad \text{Eq. 27}$$

The fault magnitude $I_{Fault}$ in Root-Means Squared (RMS) may be calculated using Equation 28:

$$I_{Fault} = \frac{\sqrt{A_{c1}^2 + A_{c2}^2}}{\sqrt{2}} \qquad \text{Eq. 28}$$

Accordingly, a fault magnitude may be calculated for a current signal even when the CT obtaining the current signal is saturated, and does not deliver a secondary signal representative of the entire waveform of the primary current signal. Furthermore, a fault magnitude may be calculated for a current signal even when samples for pre-fault current are not available. In either case, the embodiments herein improve the operation of a line-mounted sensor by calculating a fault current magnitude even when the CT is saturated, and even when pre-fault samples are not available.

Parameters of the primary fault current may be calculated using Equations 29 and 30:

$$A = \sqrt{A_{c1}^2 + A_{c2}^2} \qquad \text{Eq. 29}$$

$$\varphi = a \tan 2(A_{c2}, A_{c1}) \qquad \text{Eq. 30}$$

Further, the start of the data to be processed, $n_{start}$, may be calculated using Equation 31:

$$n_{start} = N - n_1 + 1 \qquad \text{Eq. 31}$$

Finally, the angle of the fault current φ may be calculated according to Equation 32:

$$\Phi = a \tan 2(Y_1, X_1) \qquad \text{Eq. 32}$$

where $X_1$ and $Y_1$ are calculated according to Equations 33 and 34:

$$Y_1 = A \cos(2\pi f(n_{start} + N) + \varphi) \qquad \text{Eq. 33}$$

$$X_1 = A \cos(2\pi f(n_{start} + N + N/4) + \varphi) \qquad \text{Eq. 34}$$

When the angle of the fault current φ is positive, then the fault current is in opposite direction with respect to the load current; and when the angle of the fault current φ is negative, then the fault current is in the same direction with respect to the load current. Accordingly, the line-mounted device in accordance with several embodiments herein may determine a direction to the fault by calculating a direction to the fault with respect to load current where the direction of the load current has been determined. According to several embodiments herein, the direction of the load current and direction to the fault may be calculated even under conditions of a saturated current transformer.

As has been suggested above, the line-mounted sensor may have a limited power supply, especially during a fault condition. For example, the line-mounted device may be powered by harvesting electric power from the electric power delivery system. The line-mounted sensor may store the electric power in temporary storage such as, for example, a supercapacitor, rechargeable battery, or the like. Furthermore, the line-mounted sensor may include a processor or memory of limited capacity. In either case, the line-mounted sensor may benefit from reducing computation complexity.

As the fault current magnitude matrix $M_2$ depends on system frequency f, and a fixed sampling rate N, (Equations 14, 20, 23), the line-mounted sensor may be configured with pre-populated or fixed fault current magnitude matrices $M_2$ at different frequencies that are expected. The pre-populated matrices may be predetermined for a particular nominal frequency (e.g. 60 Hz or 50 Hz), and frequencies in the range of the particular nominal frequency. For example, a line-mounted device configured to monitor an electric power delivery system with a nominal frequency of 60 Hz may be configured with pre-populated matrices of: 1) 60 Hz for measured frequencies from 59.75 Hz-60.25 Hz; 2) 60.5 Hz for measured frequencies from 60.25 Hz-60.75 Hz; 3) 59.50 Hz for measured frequencies from 59.25 Hz-59.75 Hz; and so forth. Accordingly, if the measured frequency at the time of the fault is 60.3 Hz, and four valid pairs are found, the line-mounted device would use the pre-populated matrix for 60.5 Hz with four pairs (Equation 14).

It should be noted that the ranges and numbers of pre-populated matrices may be different than described in the above embodiment. Furthermore, if the measured frequency falls outside of the ranges of the pre-populated matrices, the line-mounted device may use the Equations as described herein to calculate the matrices instead of using the pre-populated matrices.

Because the use of pre-populated matrices will result in some loss of accuracy of the fault magnitude, the line-mounted device may include correction factors for the difference between the measured frequency and the frequency of the selected pre-populated matrix. The correction factor may be applied to either the pre-populated matrix or the calculations resulting therefrom such as, for example, the fault magnitude.

As has been described above, the number of valid pairs needed to calculate the fault magnitude as at least two. To increase accuracy of the calculated fault magnitude, the line-mounted device may be configured to calculate the fault magnitude using valid pairs from different consecutive peaks according to the embodiments described herein, and then calculating an estimated fault magnitude using the calculated fault magnitudes. For example, the estimated fault magnitude may be an average of the calculated fault magnitudes. In another example, the estimated fault magnitude may be a weighted average of the calculated fault magnitudes. In one particular example, more weight may be given to fault magnitudes calculated from valid pairs from earlier peak pairs than the weights given to fault magnitudes calculated from valid pairs from later peak pairs. Alternatively, in certain embodiments, more weight may be given to fault magnitudes calculated from valid pairs from later peak pairs than weights given to fault magnitudes calculated from valid pairs from earlier peak pairs. In another particular example, more weight may be given to fault magnitudes calculated using more valid pairs than to fault magnitudes calculated from fewer valid pairs.

As generally described above, a fault current magnitude is determined during CT saturation by: sampling the current waveform once an overcurrent threshold is crossed; determining an unsaturated region; determining a DC component; removing the DC component; and, calculating a fault current magnitude with the DC component removed. The DC component is calculated and removed according to several embodiments as described above using Equations 13-25 above. It should be noted that the above embodiments do not disclose the exclusive methods of calculating and removing a DC component from a signal from a saturated CT. In various embodiments, the DC component may be a constant rather than a decaying signal, and its absolute magnitude may be greater than zero. In such an instance, the DC component may be calculated and then be removed using Equation 25. In such an embodiment, the method may first determine whether the DC component is a constant with an absolute magnitude greater than zero. If both conditions are met, then the embodiment may proceed with using the DC component instead of using Equations 13-24. Otherwise, the embodiment may continue as described above to calculate the DC component described in Equations 13-24.

Figure 7A:
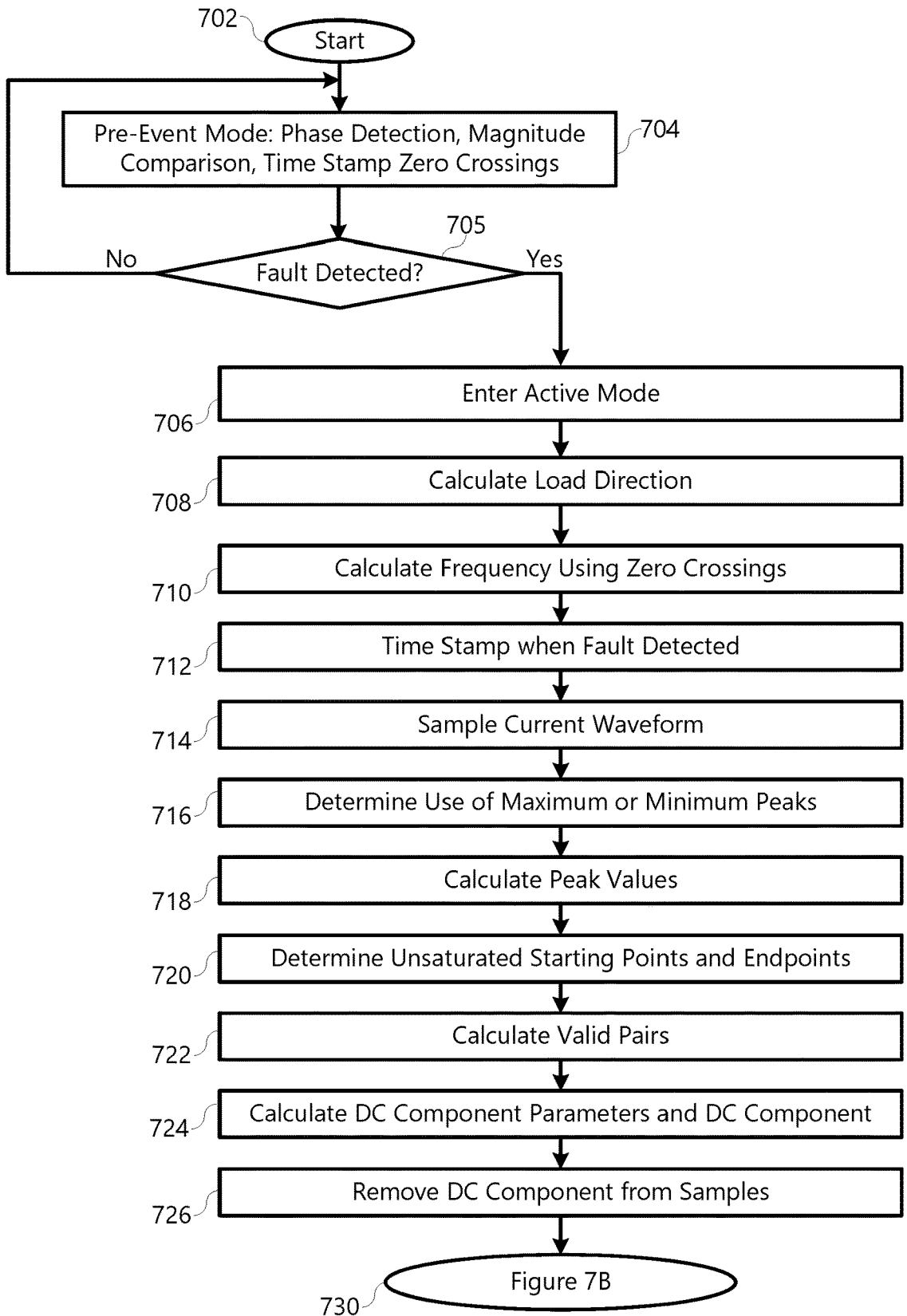
FIGS. 7A and 7B illustrate flow charts representing a method of determining a direction to a fault by a line-mounted device under CT saturation.
Figure 7B:
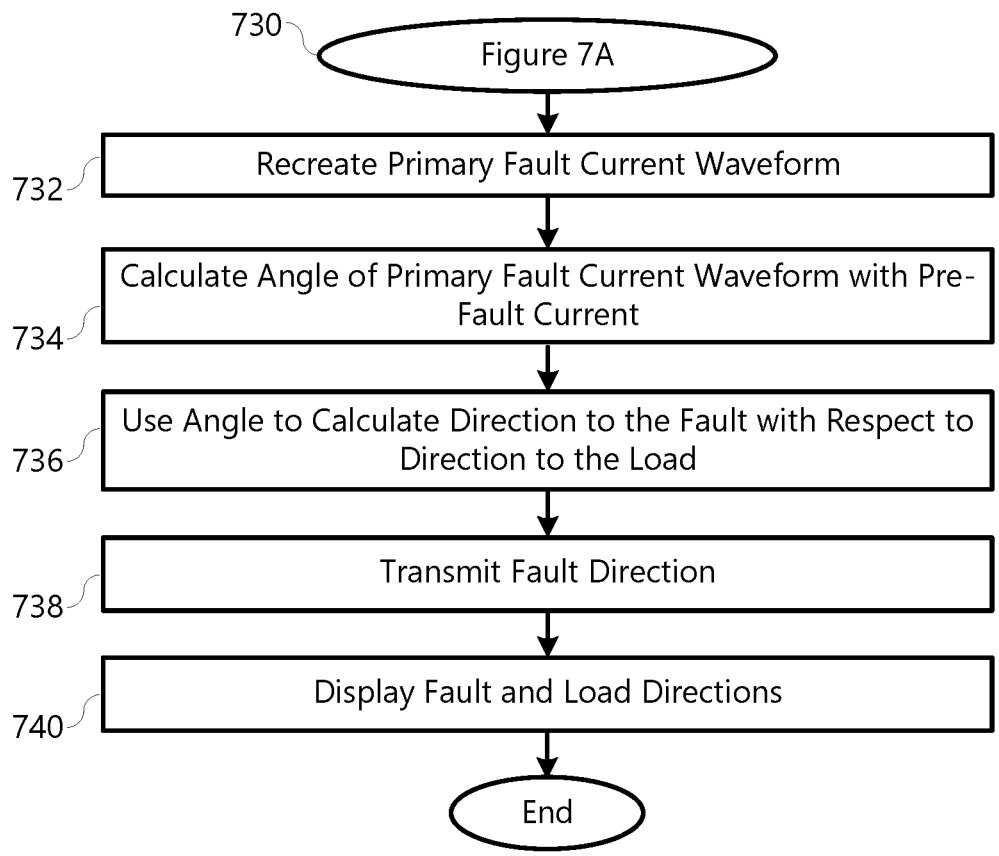

FIGS. 7A and 7B illustrate a flow chart of a method for improving the functioning of a line-mounted device by calculating and displaying a fault direction even when the CT is saturated. It should be noted that the steps shown and described may be performed in any order, any number of times, or simultaneously unless otherwise explicitly stated. The method starts 702 in pre-event or low-power mode, during which the line-mounted device performs phase detection, compares a magnitude against a threshold, and time-stamps zero crossings 704. The signal may include current, voltage, or both. In certain embodiments, the zero crossings of both the current signal and the voltage signal may be time stamped and recorded. The comparison of the current magnitude against the threshold may be used to determine if a fault has occurred and resulted in an overcurrent condition on the electric power delivery system. If a fault is not detected 705 (the current magnitude does not exceed the predetermined threshold), then the method continues in pre-event mode 704.

In various embodiments, the method may calculate load direction and display a load direction even when a fault has not been detected. That is, the method may record times of current and voltage zero crossings; calculate a load direction in accordance with Equations 1-10, and display the direction to the load and/or wirelessly transmit the direction to the load to a receiving device. Such calculation of a load direction and display/transmission of the load direction may be performed regardless of a fault detection. In such embodiments, the method may use the latest recorded load direction upon detection of a fault condition to determine the direction to the fault relative to the load direction. That is, step 708 may be performed as part of step 704 instead of after fault detection 705 in accordance with several embodiments.

If, however, a fault is detected (the current magnitude does exceed the predetermined threshold) 705, then the method continues to cause the line-mounted device to enter active mode 706. In active mode, the line-mounted device may calculate a load direction 708 using the times of the zero crossings obtained before fault detection. In embodiments where the load direction has been previously calculated, the line-mounted device may use the latest recorded load direction or re-calculate a load direction with the latest zero-crossing times. The load direction may be calculated using the time stamps of voltage and current signals as described above in accordance with Equations 1-10. Other methods for determining a load direction may be used. A frequency may also be calculated at 710 using signal zero crossings. Voltage signal crossings, current zero crossings, or both may be used to determine a frequency. Frequency may be calculated in accordance with Equation 1.

The line-mounted device also applies a time stamp to the current magnitude when the fault is detected 712. The line-mounted device also samples the current waveform 714 provided by the CT after the fault has been detected in 705. It should be noted that steps 708, 710, 712, and 714 may all be initiated upon detection of the fault 705 (upon the current magnitude exceeding the predetermined threshold). Although not separately illustrated, in various embodiments, power system frequency may be calculated during pre-event mode.

With the calculated frequency and the sampled current waveform, the line-mounted device may determine use of maximum or minimum peaks 716. This determination may be made by calculating the values of the first maximum and first minimum peak. If the first maximum peak has a larger magnitude than the first minimum peak, then the maximum peaks are used; whereas if the first minimum peak has a larger magnitude than the first maximum peak, then the minimum peaks are used.

The peak values of the maximum or minimum peaks (depending on step 716) are then calculated 718. Starting points and endpoints for unsaturated regions are determined 720. In some embodiments as described above, the samples with values closest to 90% of the peak value and 50% of the peak value may be used as starting points and endpoints of unsaturated regions for each peak. As described above, the starting points and endpoints may be different than the 90% and 50% of the above embodiments.

With the unsaturated regions determined, the line-mounted device may calculate valid pairs 722 as described above. The valid pairs may be used to calculate DC component parameters and DC components 724. With the DC component parameters and DC components, the line-mounted device may remove DC components from the samples 726. The method may then continue 730 in FIG. 7B.

With the DC component removed, the primary fault current waveform may be recreated 732. In certain embodiments, the line-mounted device may calculate the fault magnitude 728 as described herein, and transmit the fault magnitude 730 to an IED or supervisory system. The IED or supervisory system may then effect a control or monitoring operation on the electric power delivery system using the calculated and received fault magnitude from the line-powered device.

The method may calculate the angle of the primary fault current waveform with the pre-fault current 734. The angle of the fault current $\phi$ may be calculated in accordance with Equation 32. With the angle of the primary fault current and the load direction, the direction to the fault may be calculated 736. The direction to the fault may be calculated using Equations 29-34. The line-mounted device may transmit the fault direction 738, and/or display the fault and load directions 740.

Accordingly, presented herein is an improvement to the functioning of a line-mounted device in that the line-mounted device is capable of determining a fault direction even under CT saturation; and even when pre-fault samples are not available. Furthermore, presented herein is an improvement to the functioning of an electric power delivery system due to the improvement in fault direction calculation being used by the IED or supervisory system from the line-mounted device for protection and monitoring functions.

FIGS. 8A through 12B illustrate various embodiments of line-mounted devices in accordance with the disclosure herein indicating load direction and fault direction under different fault conditions. The embodiments illustrate the use of the line-mounted devices to determine a direction to a fault in an electric power delivery system.

FIG. 8A illustrates four line-mounted devices 812A, 812B, 812C, and 812D in electrical communication with conductor 802. Each line-mounted device 812A-D may include six pairs of LEDs, situated such that one set of pairs of LEDs are in one direction relative to the conductor 802 and a second set of pairs of LEDs are in the other direction relative to the conductor 802. Each pair of LEDs includes one LED to indicate a direction of the load and one LED to indicate a direction to the fault. For example, line-mounted device 812A includes six pairs of LEDs, with a set of three pairs for indicating one direction relative to the conductor 802 and another set of three pairs for indicating the other direction relative to the conductor 802. LEDs 832A and 836A are in one pair for indicating one direction relative to the conductor 802; whereas LEDs 834A and 838A are in another pair for indicating the other direction relative to the conductor 802. Outer LEDs (e.g. 832A and 834A) may be used to indicate a direction to a fault, whereas inner LEDs (e.g. 836A and 838A) may be used to indicate a direction to a load. Additional LEDs are illustrated and may be used. Line-mounted devices 812B, 812C, and 812D similarly include pairs of LEDs (e.g. 832B, 834B 836B, 838B, 832C, 834C, 836C, 838C, 832D, 834D 836D, and 838D). The LEDs may be arranged in sets to display a direction to the load and a direction to the fault. As illustrated, the line-mounted devices 812A-D each includes two sets of LEDs to display a direction. Each set of LEDs may include LEDs arranged in such a fashion to clearly indicate a direction. As illustrated, the sets may be arranged in the shape of an arrow pointing toward the indicated direction. That is, the set of LEDs 834A, 842A, and 846A are arranged in an "arrow" pattern to clearly indicate a direction to a fault along the conductor 802. Similarly, LEDs 838A, 840A, and 844A are arranged in an "arrow" pattern to clearly indicate a direction of a load along the conductor 802. Each of these sets is arranged with the center LED at the "tip" of the arrow pointing along the conductor 802. Upon visual inspection of the line-mounted devices, a line crew may clearly observe the direction of the load and/or the direction to the fault due to the arrangement and illumination of the LEDs.

As illustrated in FIG. 8A, load 820 is indicated between line-mounted devices 812B and 812C. The line-mounted devices 812A-D may be configured according to several embodiments described herein to determine a pre-fault load direction. According to some embodiments, the load direction may be indicated using, for example, LEDs. As illustrated, LEDs 838A, 838B, 836C, and 836D are illuminated (along with other LEDs situated in the direction of the load relative to the conductor 802) to indicate a load direction. As illustrated in FIG. 8B, load 822 is indicated to the left of all illustrated line-mounted devices 812A-D. Thus, LEDs 836A, 836B, 836C, 836D are illuminated (along with other LEDs situated in the direction of the load relative to the conductor 802) to indicate a load direction. In various embodiments, the LEDs may be illuminated in a particular color to indicate a load direction. For example, the color of load direction indication may be green. In various embodiments, the line-mounted devices may consistently determine and indicate a load direction. In other embodiments, the line-mounted devices may only indicate a load direction upon detection of a fault condition.

FIGS. 9A and 9B illustrate line-mounted devices 812A-D in electrical communication with conductor 802. Load 820 is illustrated between line-mounted devices 812B and 812C in FIG. 9A. LEDs toward the load 820 (e.g. LEDs 838A, 838B, 836C, and 836D) may be illuminated in a first color to indicate the direction to the load. A fault 914 is present, also between line-mounted devices 812B and 812C. Line mounted devices 812A-D detect the fault 914 and, in accordance with the several embodiments herein determine the direction to the fault relative to the direction to the load. Accordingly, the line mounted devices 812A-D illuminate the appropriate LEDs in the direction to the fault 914 to illustrate the direction to the fault 914. As illustrated, LEDs in the direction to the fault (e.g. LEDs 834A, 834B, 832C, and 832D) may be illuminated in a second color to display the direction to the fault. In several embodiments, the color indicating a direction to a fault may be red. The location of the fault may be determined by observation of the line-mounted devices 812A-D. As illustrated, the location of fault 914 may be determined by locating two line-mounted devices 812B, 812C that each indicate the direction of the fault toward each other.

Similarly, load 822 of FIG. 9B is illustrated to the left of all of the line-mounted devices 812A-D. Fault 916 is indicated between line-mounted devices 812B and 812C. Appropriate LEDs in the direction of the load (e.g. LEDs 836A, 836B, 836C, 836D) are illuminated in a first color to indicate a direction to a load. Appropriate LEDs in the direction of the fault (e.g. LEDs 834A, 834B, 832C, 832D) are illuminated in a second color to indicate a direction to the fault. The location of the fault may be determined by observation of two line-mounted devices 812B, 812C that each indicate the direction of the fault as toward the other.

Figure 10:
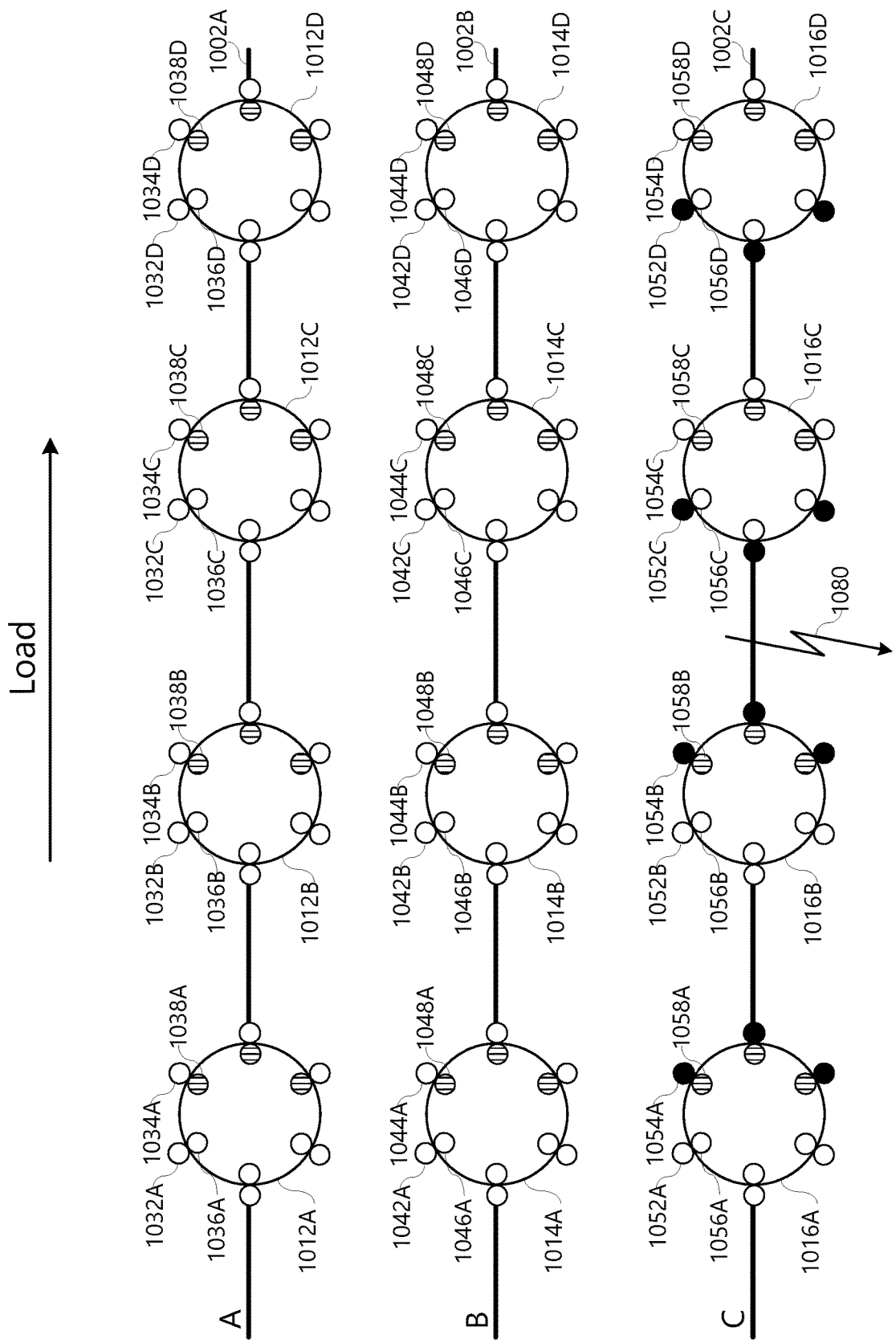
FIG. 10 illustrates a series of line-mounted devices on a three-phase electric power delivery system under a single-phase-to-ground fault and indications of load direction and fault direction by the line-mounted devices.

The line-mounted devices herein may be used on multi-phase systems to indicate the direction to the fault as well as the faulted phase. FIG. 10 illustrates three conductors 1002A, 1002B, 1002C of a three-phase (A, B, C) electric power delivery system. Line-mounted devices 1012A, 1012B, 1012C, and 1012D may be in electrical communication with conductor 1002A; line-mounted devices 1014A, 1014B, 1014C, and 1014D may be in electrical communication with conductor 1002B; and, line-mounted devices 1016A, 1016B, 1016C, and 1016D may be in electrical communication with conductor 1002C. The direction of the load may be indicated by illumination of appropriate LEDs or LEDs in the first color (e.g. LEDs 1038A, 1038B, 1038C, and 1038D of the A-phase; LEDs 1048A, 1048B, 1048C, and 1048D of the B-phase; and LEDs 1058A, 1058B, 1058C, and 1058D of the C-phase).

Upon occurrence of a single-phase-to-ground fault 1080 on the C-phase, the line-mounted devices 1016A-D in accordance with several embodiments herein may detect the fault 1080, determine the direction to the fault 1080, and indicate the direction to the fault 1080 in relation to the load. As illustrated, line-mounted devices 1016A and 1016B determine that the direction to the fault is in the same direction as the load, and illuminate appropriate LEDs (e.g. 1054A and 1054B) in a pre-determined color to indicate a direction to the fault 1080. Line mounted devices 1016C and 1016D determine that the direction to the fault 1080 is opposite to the direction of the load, and illuminate appropriate LEDs (e.g. 1052C and 1052D) in the pre-determined color to indicate the direction to the fault. By observation of the line-mounted devices, it may be determined that the fault 1080 is not on the A- or B-phases, but is on the C-phase. Further, it may be observed that the fault 1080 is located in a line section between line-mounted devices 1016B and 1016C, as these line-mounted devices indicate a direction to the fault as between these two line-mounted devices.

The line-mounted devices according to the embodiments herein may be helpful for a line crew to determine a faulted phase and the faulted line section. Upon determining a fault location, the line crew may be able to make the appropriate repairs. In the presently-illustrated embodiment, observation of any of the line-mounted devices on the faulted phase (1016A-D) will indicate the faulted phase. Further, observation of any of the line-mounted devices on the faulted phase will indicate the direction to the fault. Even if a line crew can only observe indicator 1016A initially, the line crew will be able to observe the direction to the fault, and follow the line 1002C in the proper direction to the fault. Upon observation of line-mounted device 1016B, the line crew will continue along the line in the same direction until either encountering the fault itself, or indicator 1016C. Because indicator 1016C indicates a fault direction toward indicator 1016B; and indicator 1016B indicates a fault direction toward indicator 1016C, the line crew will be able to easily deduce that the faulted section is between indicators 1016B and 1016C. Accordingly, the embodiments of the present disclosure may be used to easily find the faulted phase and faulted section even under saturated CT conditions.

FIGS. 11A, 11B, 11C, and 11D also illustrate line-mounted devices 1012A-D, 1014A-D, and 1016A-D in electrical communication with phase conductors 1002A-C of a three-phase electric power delivery system. As illustrated in FIG. 11A, a two-phase fault 1180 occurs on both phases B and C, and is detected by the line-mounted devices 1014A-D and 1016A-D associated with phases B and C. As previously described, the load direction may be determined by the line-mounted devices and indicated according to the various embodiments herein. Line-mounted devices 1014A-D and 1016A-D may detect the fault, determine a load direction, determine a fault direction in relation to the load direction, and indicate the determined fault direction. As illustrated, the fault location may be easily determined as between line-mounted devices 1014B and 1014C of the B-phase, and between line-mounted devices 1016B and 1016C of the C-phase. This can be seen as devices 1014B and 1014C display a fault direction toward each other, as do devices 1016B and 1016C. In particular, the line-mounted devices 1014A, 1014B, 1014C, 1014D, 1016A, 1016B, 1016C, and 1016D properly indicate a direction to the fault 1180 and illuminate the proper LEDs (e.g. LEDs 1044A, 1044B, 1042C, 1042D, 1054A, 1054B, 1052C, and 1052D) to indicate a direction to the fault. A line crew encountering any of the line-mounted devices 1014A-D or 1016A-D will be able to easily determine both the faulted phases (due to sensors on the faulted phases indicating a direction to the fault, where the sensors on the unfaulted phase do not indicate a direction to the fault) and the location of the fault 1180 by simply following the LEDs indicating a direction to the fault until the line crew found two neighboring devices with fault direction displays pointing toward each other (e.g. devices 1014B and 1014C or devices 1016B and 1016C).

Similarly, FIG. 11B illustrates the line-mounted devices 1012A-D, 1014A-D, and 1016A-D determining and indicating a direction of the load by illumination of the appropriate LEDs in the pre-determined color. It should be noted that where the load of the system illustrated in FIG. 11A was left-to-right, the load of the system illustrated in FIG. 11B is from the outside toward the middle. Upon occurrence of a two-phase fault 1180 on phases B and C, the line-mounted devices 1014A-D and 1016A-D detect the fault 1180, determine a direction to the fault 1180 in relation to the direction of the load, and indicate a direction to the fault by illumination of the appropriate LEDs in a predetermined color. Again, a line crew encountering any of the line-mounted devices 1014A-D or 1016A-D will be able to easily determine both the faulted phases (due to sensors on the faulted phases indicating a direction to the fault, where the sensors on the unfaulted phase do not indicate a direction to the fault) and the location of the fault 1180 by simply following the LEDs indicating a direction to the fault until the line crew found two neighboring devices with fault direction displays pointing toward each other (e.g. devices 1014B and 1014C or devices 1016B and 1016C).

While the systems as illustrated in FIGS. 11A-B are representative of a vast majority of faults and fault indications, there exist a few rare instances where line-mounted devices may not all indicate the proper direction to the fault. FIGS. 11C-D illustrate two such systems. As illustrated in FIG. 11C, with the load direction from left-to-right (and properly indicated by all line-mounted devices), and a two-phase fault on phases B and C between devices 1014B and 1014C (B-phase) and 1016B and 1016C (C-phase), line mounted devices 1014A, 1014B, 1016A, 1016B, 1016C, and 1016D properly indicate the direction to the fault. However, line-mounted devices 1014C and 1014D do not properly indicate the direction to the fault. In this rare case, the line crew would easily be able to determine the faulted phases, but would need to find two line-mounted devices that indicate the fault direction as toward each other (e.g. devices 1016B and 1016C) in order to determine the faulted line section. When the devices include wireless communication capabilities, and report the fault direction to a central system, the system may be able to identify the faulted line section by determining the line-mounted devices that indicate the fault direction as toward each other.

FIG. 11D similarly illustrates a rare case where line-mounted devices 1014A-D improperly indicate the fault direction (with the load direction from the outside toward the middle), while devices 1016A-D properly indicate the fault direction. As previously discussed, a line crew would easily determine the faulted phases, but would need to examine the line-mounted devices to find two that indicated the fault direction as toward each other in order to determine the faulted line section. Again, when the devices include wireless communication capabilities, and report the fault direction to a central system, the system may be able to identify the faulted line section by determining the line-mounted devices that indicate the fault direction as toward each other.

Figure 12A:
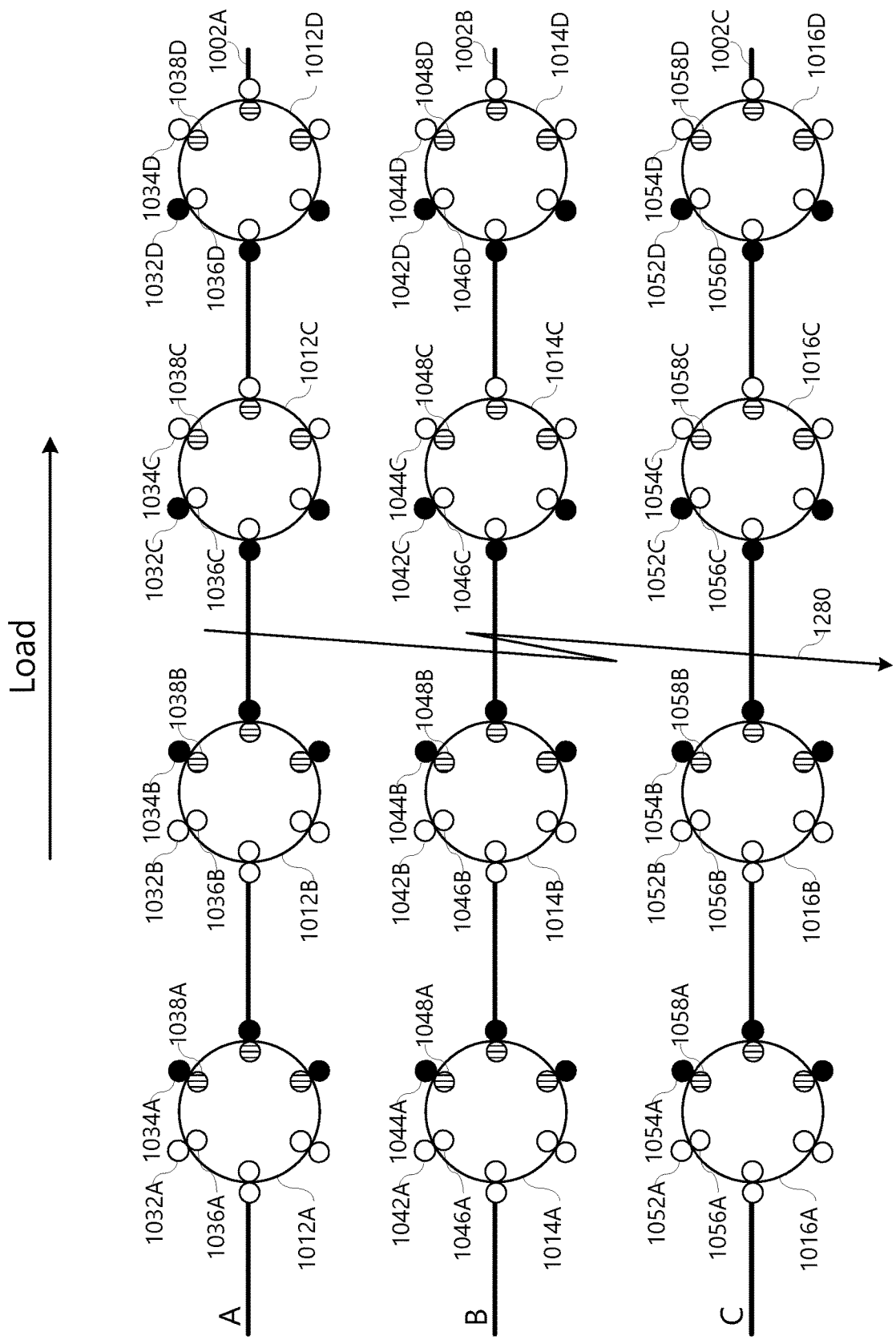
FIGS. 12A and 12B illustrate a series of line-mounted devices on a three-phase electric power delivery system under a three-phase fault and indications of load direction and fault direction by the line-mounted devices.
Figure 12B:
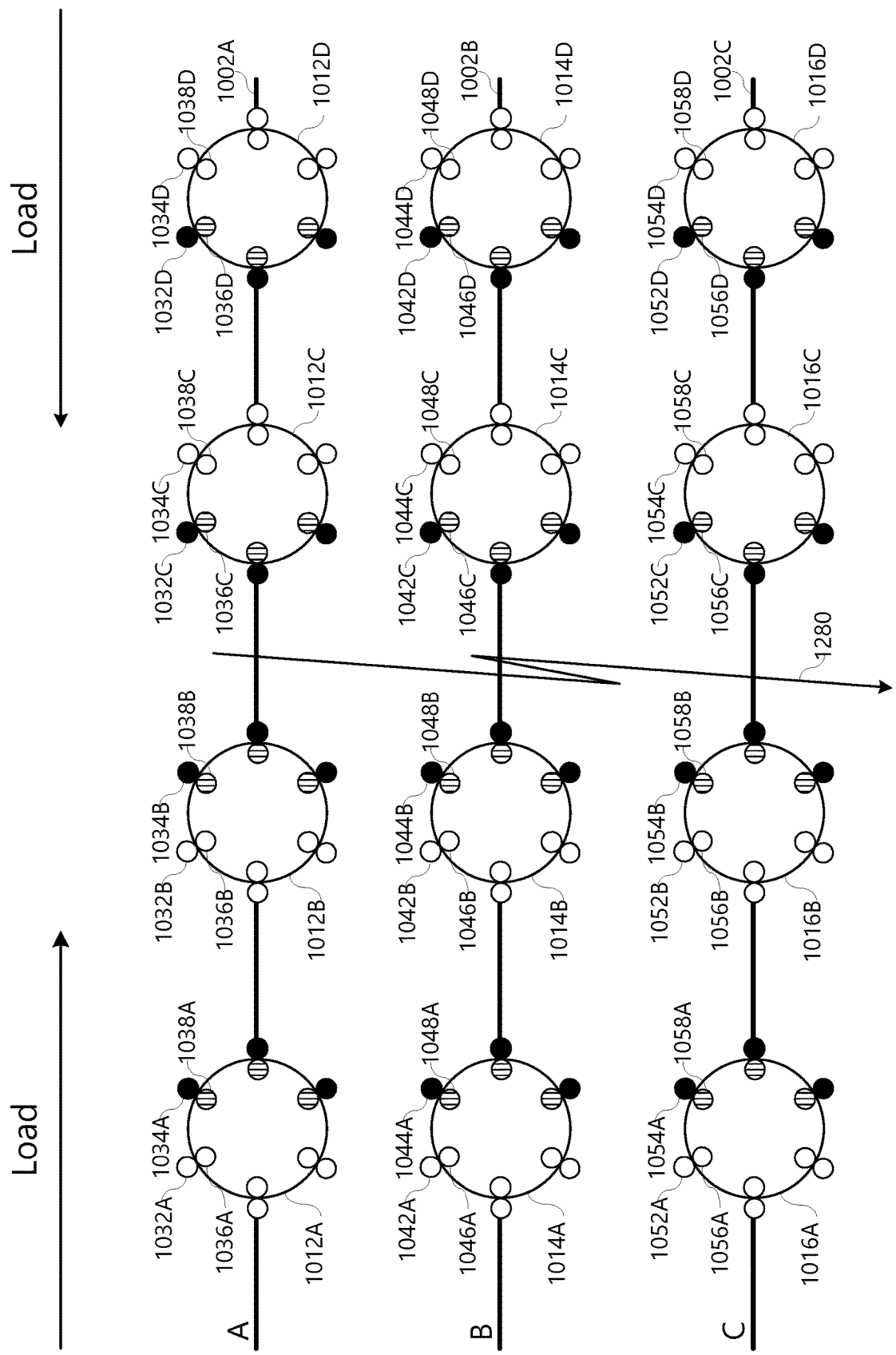

FIGS. 12A and 12B illustrate three-phase faults 1280 on three-phase electric power delivery systems, and line-mounted devices as described herein indicating a direction to the fault 1280. In particular, FIG. 12A illustrates line-mounted devices 1012A-D in electrical communication with A-phase conductor 1002A; line-mounted devices 1014A-D in electrical communication with B-phase conductor 1002B, and line-mounted devices 1016A-D in electrical communication with C-phase conductor 1002C; with the load flowing from left to right. Upon occurrence of three-phase fault 1280, all line-mounted devices 1012A-D, 1014A-D, and 1016A-D indicate a direction of the load by illumination of the appropriate LEDs in the predetermined color (e.g. LEDs 1038A-D, 1048A-D, and 1058A-D). Further, the line-mounted devices detect the occurrence of the fault 1280, determine a direction to the fault 1280 in relation to the direction of the load, and indicate the direction to the fault by illumination of the appropriate LEDs in the predetermined color (e.g. LEDs 1034A, 1034B, 1032C, 1032D of the A-phase; LEDs 1044A, 1044B, 1042C, 1042D of the B-phase; and LEDs 1054A, 1054B, 1052C, 1052D of the C-phase). By observation, the faulted line section may be determined as the section between the pairs of line-mounted devices that indicate the direction to the fault as toward each other. For example, line-mounted device 1012B may indicate the direction of the fault toward line-mounted device 1012C, which indicates the direction of the fault toward line-mounted device 1012B.

Similarly, FIG. 12B illustrates a three-phase fault 1280 on a three-phase electric power delivery system where the load directions are from the right and left toward the center. Line mounted devices 1012A-D, 1014A-D, and 1016A-D properly indicate the direction of the load by illumination of the appropriate LEDs in the predetermined color (e.g. LEDs 1038A, 1038B, 1036C, 1036D, 1048A, 1048B, 1046C, 1046D, 1058A, 1058B, 1056C, and 1056D); detect the fault; determine a direction to the fault in relation to the load direction; and indicate the direction to the fault by illumination of the appropriate LEDs in the predetermined color (e.g. 1034A, 1034B, 1032C, 1032D, 1044A, 1044B, 1042C, 1042D, 1054A, 1058B, 1052C, and 1052D). By observation, the faulted line section may be determined as the section between the pairs of line-mounted devices that indicate the direction to the fault as toward each other. For example, line-mounted device 1012B may indicate the direction of the fault toward line-mounted device 1012C, which indicates the direction of the fault toward line-mounted device 1012B. Similarly, line-mounted devices 1014B and 1014C indicate the faulted section as the section between these devices by indicating a direction to the fault as toward each other, and line-mounted devices 1016B and 1016C indicate the faulted section as the section between these devices by indicating a direction to the fault as toward each other.

Although the illustrated embodiments illustrate line-mounted devices indicating the direction of the load, in several embodiments the line-mounted devices may not indicate a direction of a load. In other embodiments, the line-mounted devices may only indicate a direction of a load after detection of a fault condition. Further, separate sets and pairs of LEDs are illustrated, but according to various embodiments fewer LEDs may be used, and the same LED may be used to indicate the direction of the load and/or direction to the fault by illumination as different colors. For example, the same LED may be illuminated green to indicate a direction of the load, or red to indicate a direction to the fault. Different predetermined colors or flashing patterns, or the like may be used to indicate a direction of the load and/or direction to the fault.

It should be noted that although the line-mounted devices described herein may be illustrated as applied to a distribution portion of an electric power delivery system, the line-mounted devices may be applied to any portion of an electric power delivery system including transmission, distribution, generation, and consumption; as well as at different voltage and current levels. Furthermore, the line-mounted devices herein may be applied to overhead portions of a power system, underground portions of a power system, or enclosed portions of a power system.

Furthermore, it should be noted that the improvements herein are applicable to any system configured to determine a direction of the load and fault direction under saturated CT conditions. Accordingly, any device, such as an IED, that obtains secondary current signals from a saturated CT may use the improvements herein to determine a fault direction related to load direction.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A line-mounted device for an electric power delivery system, configured to determine a direction to a fault under conditions of a saturated current transformer (CT), comprising:
    a current transformer in electrical communication with a conductor of the electric power delivery system, comprising a core and a winding including secondary leads;
    sensor circuitry in electrical communication with the secondary leads, configured to:
        calculate a frequency of a current signal on the electric power delivery system using zero-crossings a secondary current signal from the secondary leads;
        record zero-crossings of a voltage signal;
        compare a current magnitude of the secondary current signal against a predetermined fault current threshold;
        when the current magnitude exceeds the predetermined fault current threshold, signal a controller of a fault condition;
    the controller in communication with the sensor circuitry, comprising:
        a processor;
        a non-transitory computer-readable storage in communication with the processor, comprising instructions that when operated cause the processor to:
            record samples of the secondary current signal from the sensor circuitry to form a sampled secondary signal;
            calculate a load direction using the zero crossings of the secondary current signal and the zero crossings of the voltage signal;
            calculate a DC component of the sampled current secondary signal;
            remove the DC component from the sampled current secondary signal;
            calculate a direction to the fault in relation to the load direction using the sampled current secondary signal with the DC component removed; and
            indicate the direction to the fault.

2. The line-mounted device of claim 1, further comprising communication circuitry in communication with the processor for transmitting the calculated fault direction to a consuming device.

3. The line-mounted device of claim 1, wherein the non-transitory computer-readable storage medium comprises further instructions that cause the processor to:
    determine first and second peaks of the secondary current signal;
    calculate a first unsaturated region of the first peak of the secondary signal and a second unsaturated region of the second peak of the secondary current signal;
    determine valid pairs of samples from the sampled current secondary signal within the first and second unsaturated regions; and
    calculate the DC component of the sampled current secondary signal from the valid pairs of samples.

4. The line-mounted device of claim 3, wherein each of the valid pairs includes a first sample in the first unsaturated region and a second sample in the second unsaturated region.

5. The line-mounted device of claim 1, wherein the secondary current signal is distorted due to saturation of the CT.

6. The line-mounted device of claim 1, wherein the direction of the load is calculated by
    calculating a difference between a zero-crossing time of the voltage signal and a zero-crossing time of the secondary current signal; and,
    comparing the difference with calculated thresholds.

7. The line-mounted device of claim 6, wherein the calculated thresholds are functions of the calculated power system frequency.

8. The line-mounted device of claim 6, wherein the zero-crossing time of the voltage signal comprises the latest zero-crossing time of the voltage signal before the controller is signaled of the fault condition, and the zero-crossing time of the secondary current signal comprises the latest zero-crossing time of the secondary current signal before the controller is signaled of the fault condition.

9. A method of improving functioning of a line-mounted device in determining fault direction in presence of current transformer (CT) saturation, comprising the steps of:
    before detection of a fault, the line-mounted device receiving a secondary current signal using the CT in electrical communication with an electric power delivery system, receiving voltage signals from the electric power delivery system, determining zero crossings of the secondary current signal and zero crossings of the voltage signals, time stamping and recording the current and voltage zero crossings, and comparing a magnitude of the secondary current signal with a predetermined fault current threshold;
    calculate a power system frequency using the zero crossings;
    calculate a load direction using the time stamps of the zero crossings of the secondary current signal and the voltage signal;
    upon the magnitude of the secondary current signal exceeding the predetermined fault current threshold, the line-mounted device:
        sampling the secondary current signal to form a sampled secondary current signal;
        calculating a DC component of the sampled secondary current signal from the sampled secondary current samples;
        removing the DC component of the sampled secondary current signal; and
        calculating a direction to the fault in relation to the load direction from the sampled secondary current signal with the DC component removed; and
    indicating the fault direction.

10. The method of claim 9, further comprising the steps of:

determining first and second peaks of the secondary current signal using the sampled secondary current signal;

calculating a first unsaturated region of the first peak of the secondary signal and a second unsaturated region of the second peak of the secondary current signal;

determining valid pairs of samples from the sampled secondary current signal within the first and second unsaturated regions; and the calculation of the DC component is from the valid pairs of samples.

11. The method of claim 9, wherein calculating the load direction comprises:

calculating a difference between a zero crossing time of the voltage signal and a zero crossing time of the secondary current signal; and comparing the difference with calculated thresholds.

12. The method of claim 11, wherein the calculated thresholds are functions of the calculated power system frequency.

13. The method of claim 11, wherein the zero-crossing time of the voltage signal comprises the latest zero-crossing time of the voltage signal before the controller is signaled of the fault condition, and the zero-crossing time of the secondary current signal comprises the latest zero-crossing time of the secondary current signal before the controller is signaled of the fault condition.

* * * * *